US012666935B2

(12) United States Patent
Dolejsi et al.

(10) Patent No.: US 12,666,935 B2
(45) Date of Patent: Jun. 23, 2026

(54) IMPLANTATION THROUGH AN ETCH STOP LAYER

(71) Applicant: Intel Corporation, Santa Clara, CA (US)

(72) Inventors: Moshe Dolejsi, Portland, OR (US); Harish Ganapathy, Portland, OR (US); Travis W. Lajoie, Forest Grove, OR (US); Deepyanti Taneja, Happy Valley, OR (US); Huiying Liu, Portland, OR (US); Cheng Tan, Hillsboro, OR (US); Timothy Jen, Portland, OR (US); Van H. Le, Beaverton, OR (US); Abhishek A. Sharma, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 276 days.

(21) Appl. No.: 17/656,366

(22) Filed: Mar. 24, 2022

(65) Prior Publication Data
US 2023/0307291 A1      Sep. 28, 2023

(51) Int. Cl.
H10W 20/00        (2026.01)
H10B 12/00        (2023.01)
H10W 20/42        (2026.01)

(52) U.S. Cl.
CPC ........ H10W 20/074 (2026.01); H10B 12/033 (2023.02); H10W 20/051 (2026.01); H10W 20/42 (2026.01)

(58) Field of Classification Search
None
See application file for complete search history.

(56) References Cited

U.S. PATENT DOCUMENTS

| | | | | |
|---|---|---|---|---|
| 2003/0042605 A1* | 3/2003 | Andideh | ............. | H01L 23/5329 |
| | | | | 257/742 |
| 2007/0238309 A1* | 10/2007 | He | .................... | H01L 21/76832 |
| | | | | 438/758 |
| 2010/0314763 A1* | 12/2010 | Sohn | ................. | H01L 21/76834 |
| | | | | 438/692 |
| 2014/0256064 A1* | 9/2014 | Taylor, Jr. | ......... | H01L 21/76826 |
| | | | | 438/4 |
| 2018/0366369 A1* | 12/2018 | Lin | ................... | H01L 21/76895 |
| 2019/0304982 A1* | 10/2019 | Sharma | ............. | H10B 12/0335 |
| 2020/0035683 A1* | 1/2020 | Sharma | ............. | H10D 30/6729 |
| 2023/0268276 A1* | 8/2023 | Ahn | .................... | H01L 21/7682 |
| | | | | 257/758 |

* cited by examiner

*Primary Examiner* — Yara B Green
*Assistant Examiner* — Fakeha Sehar
(74) *Attorney, Agent, or Firm* — Arcane Law PLLC

(57) ABSTRACT

An integrated circuit includes a first layer comprising dielectric material. One or both of an interconnect feature and a device are within the dielectric material of the first layer. The integrated circuit further includes a second layer above the first layer, where the second layer includes dielectric material. A third layer is between the first layer and the second layer. In an example, the third layer can be, for example, an etch stop layer or a liner layer or barrier layer. In an example, an impurity is within the first layer and the third layer. In an example, the impurity has a detectable implant depth profile such that a first distribution of the impurity is within the first layer and a second distribution of the impurity is within the third layer.

23 Claims, 17 Drawing Sheets

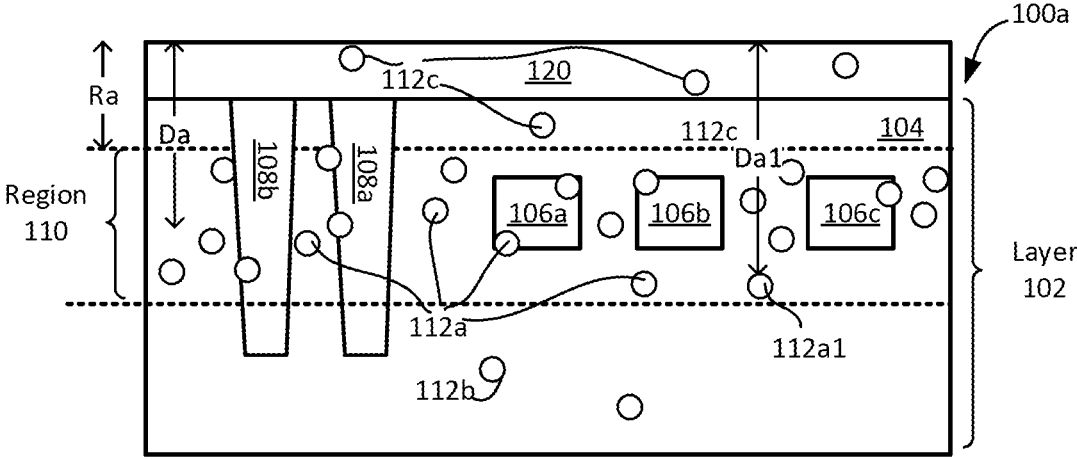
FIG. 5D1
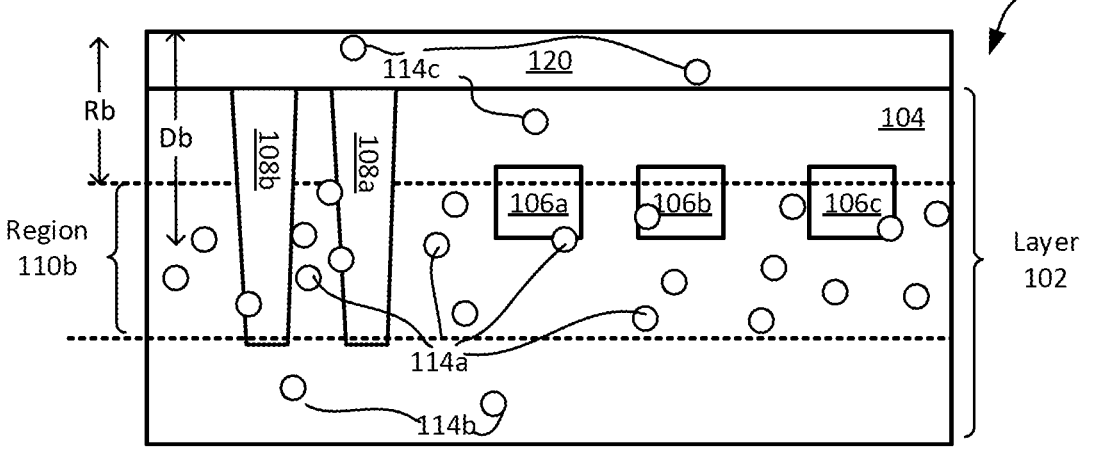
FIG. 5D2
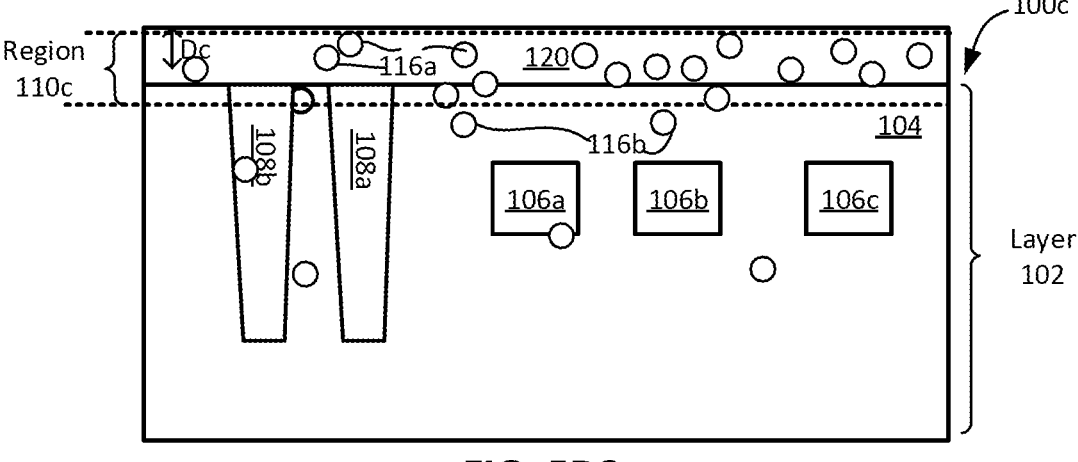
FIG. 5D3

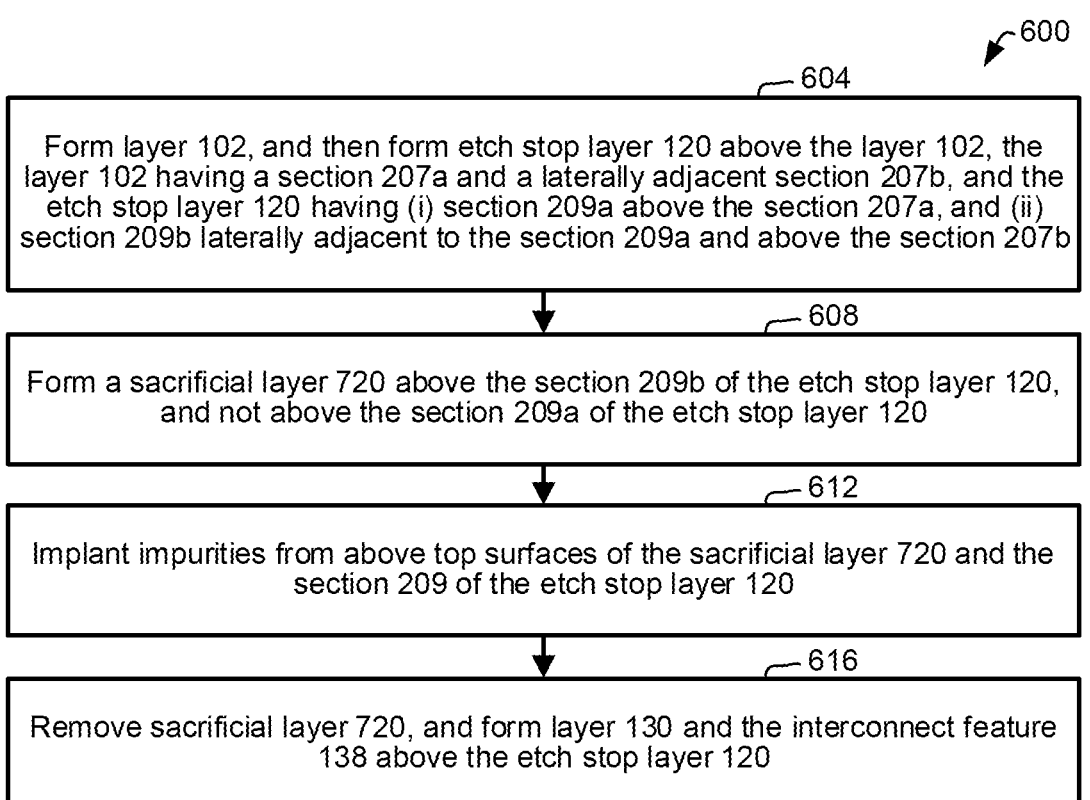

*600*

*604*

Form layer 102, and then form etch stop layer 120 above the layer 102, the layer 102 having a section 207a and a laterally adjacent section 207b, and the etch stop layer 120 having (i) section 209a above the section 207a, and (ii) section 209b laterally adjacent to the section 209a and above the section 207b

*608*

Form a sacrificial layer 720 above the section 209b of the etch stop layer 120, and not above the section 209a of the etch stop layer 120

*612*

Implant impurities from above top surfaces of the sacrificial layer 720 and the section 209 of the etch stop layer 120

*616*

Remove sacrificial layer 720, and form layer 130 and the interconnect feature 138 above the etch stop layer 120

FIG. 6

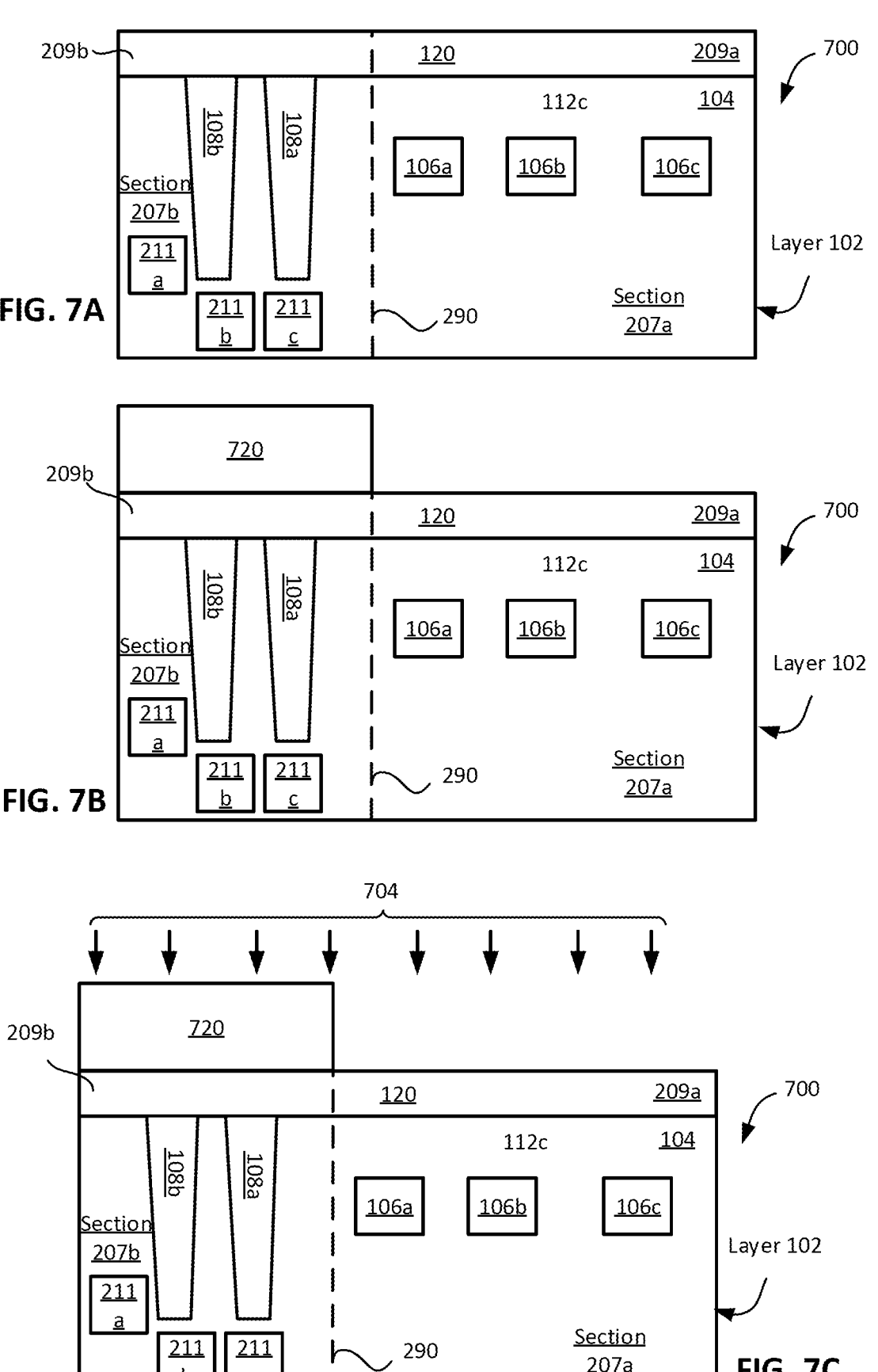

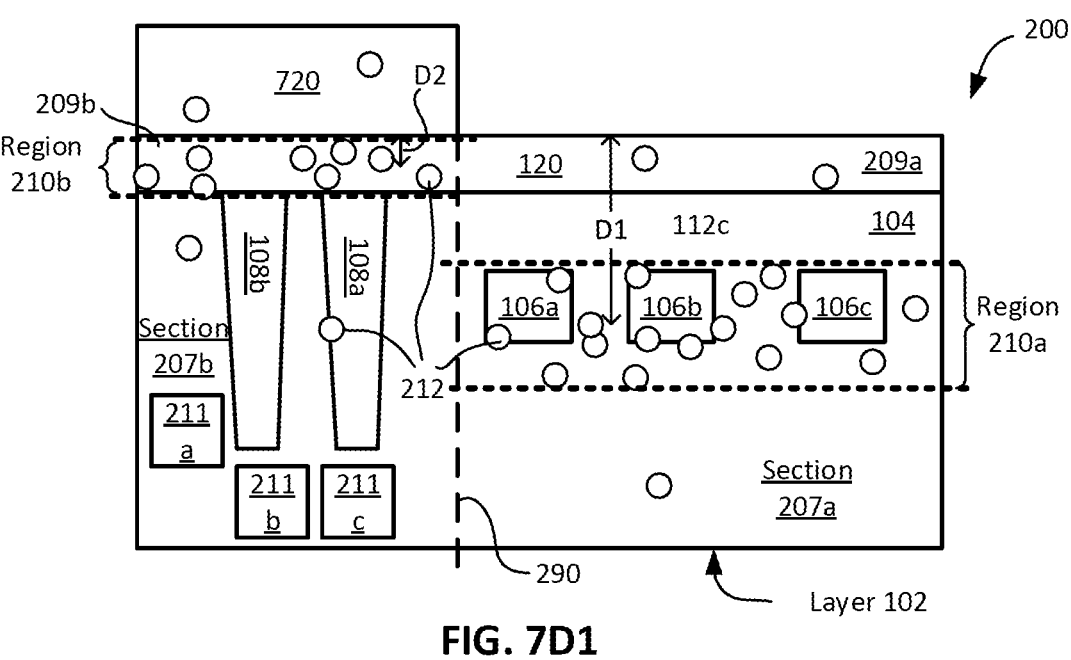
FIG. 7D1
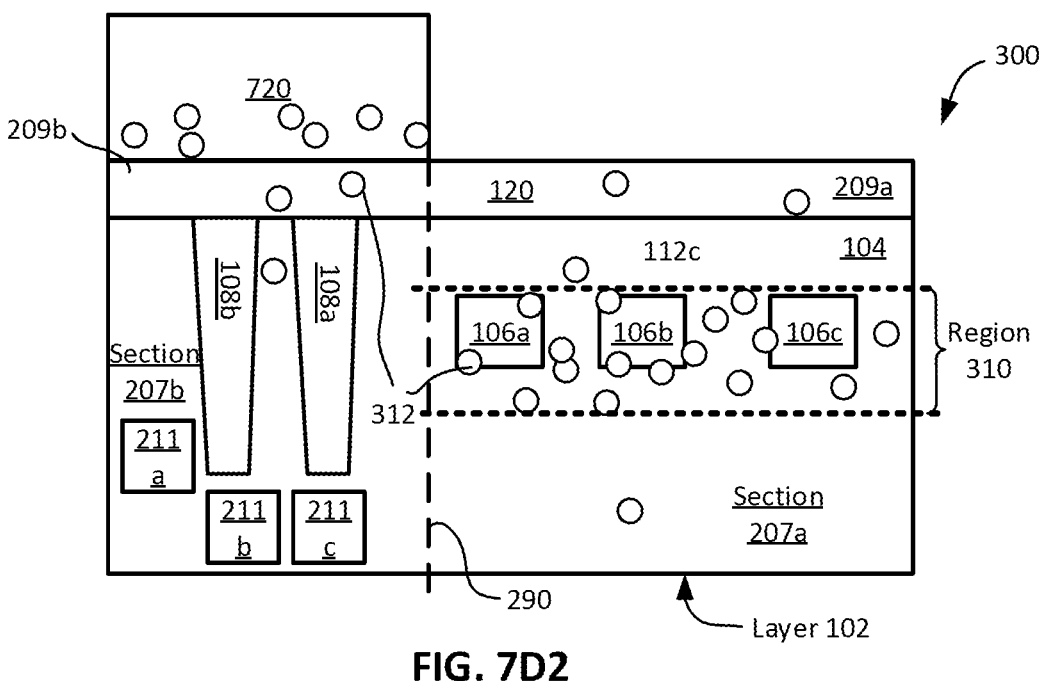
FIG. 7D2

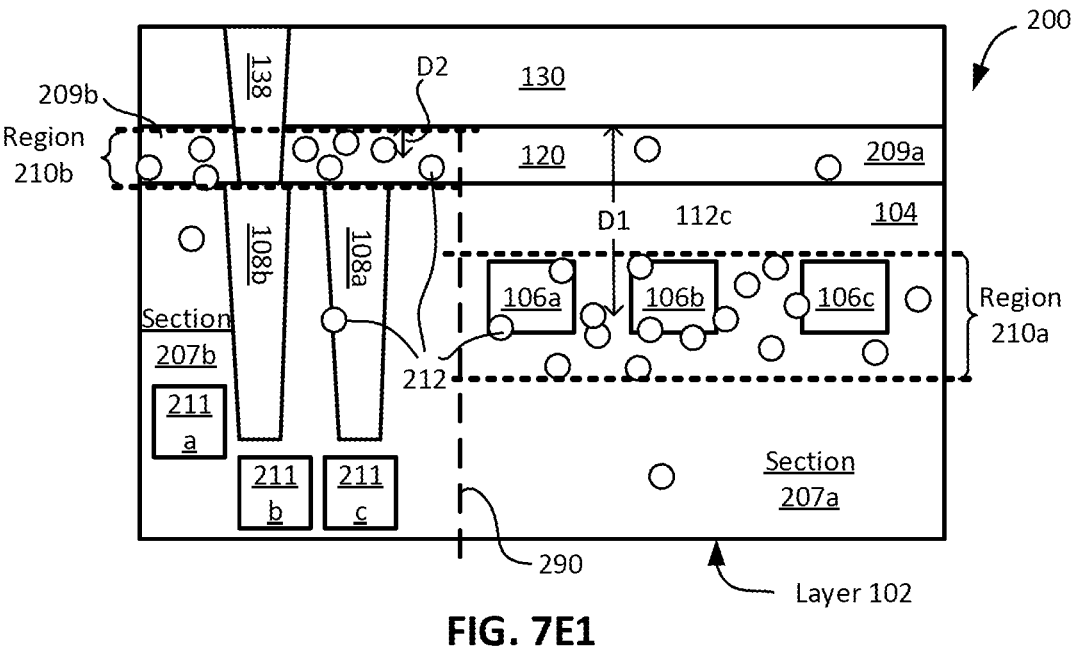
FIG. 7E1
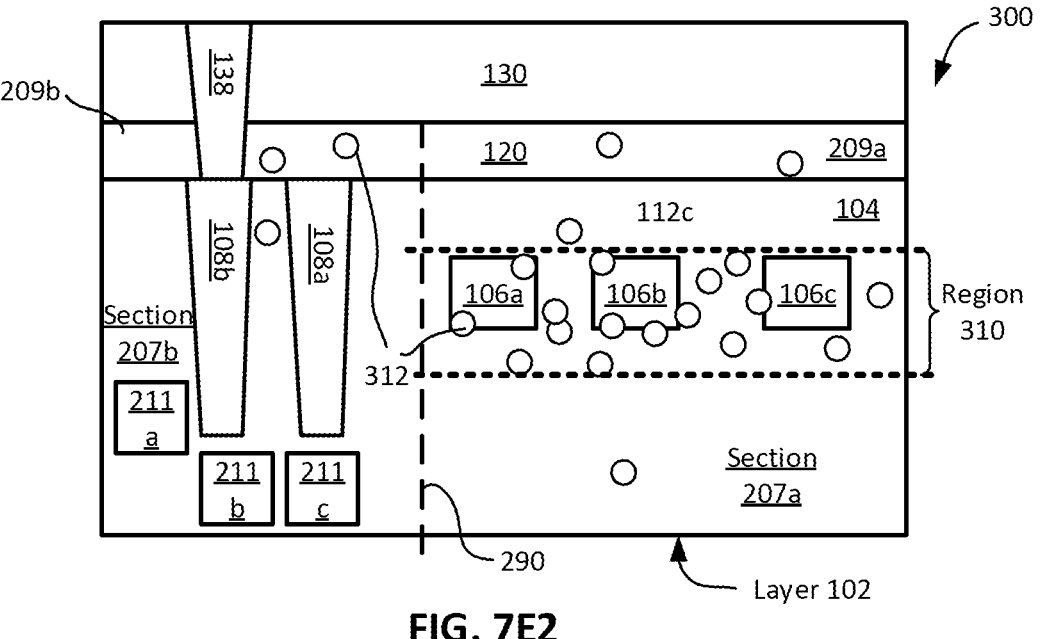
FIG. 7E2

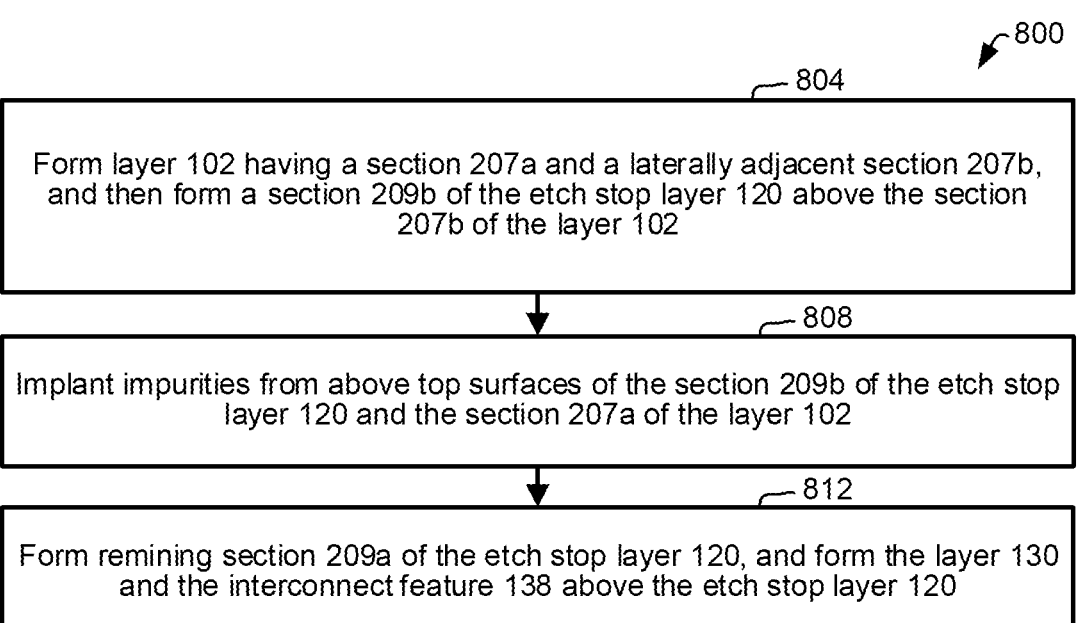

Form layer 102 having a section 207a and a laterally adjacent section 207b, and then form a section 209b of the etch stop layer 120 above the section 207b of the layer 102

Implant impurities from above top surfaces of the section 209b of the etch stop layer 120 and the section 207a of the layer 102

Form remining section 209a of the etch stop layer 120, and form the layer 130 and the interconnect feature 138 above the etch stop layer 120

FIG. 8

IMPLANTATION THROUGH AN ETCH STOP LAYER

FIELD OF THE DISCLOSURE

The present disclosure relates to integrated circuits, and more particularly, to etch stop layers in integrated circuits.

BACKGROUND

In modern integrated circuits, an etch stop layer is usually composed of a dielectric material and can be used between different layers of a given die. An etch stop acts to stop an etch process at the bottom of, and/or within as the case may be, a layer that is above the etch stop layer. For example, an interconnect structure usually includes multiple interconnect layers arranged in a stack above or below a device layer of a die. Each of the interconnect layers may include, for instance, dielectric material and one or more conductive interconnect features (e.g., vias and/or lines) and/or devices (e.g., transistor and capacitor of memory cell). The interconnect layers of the stack are usually separated from one another by an etch stop layer. An example etch stop layer is a relatively thin (e.g., 2 to 1000 nanometers) layer of silicon nitride. There remain nontrivial issues associated with etch stop layers.

BRIEF DESCRIPTION OF THE DRAWINGS

FIGS. 5A, 5B, 5C, 5D1, 5D2, 5D3, and 5E illustrate cross-sectional views of an IC (such as the IC of FIG. 1A) in various stages of processing, in accordance with an embodiment of the present disclosure.

FIG. 6 illustrates a flowchart depicting a method of forming an IC (such as the IC of FIG. 2A or the IC of FIG. 3) comprising (i) a first layer comprising a plurality of devices and one or more interconnect features, (ii) an etch stop layer above the first layer, and (iii) a second layer (such as an interconnect layer) above the etch stop layer, wherein the first layer has a first section and a laterally adjacent second section, and impurity ions are implanted through the etch stop layer and within the first layer and/or the etch stop layer, such that a concentration of the impurity ions within the first section of the first layer is higher than a concentration of the impurity ions within the second section of the first layer, in accordance with an embodiment of the present disclosure.

FIGS. 7A, 7B, 7C, 7D1, 7D2, 7E1, and 7E2 illustrate cross-sectional views of an IC (such as the IC of FIG. 2A or the IC of FIG. 3) in various stages of processing, in accordance with an embodiment of the present disclosure.

FIG. 8 illustrates a flowchart depicting a method of forming an IC (such as the IC of FIG. 2C) comprising (i) a first layer having a plurality of devices and one or more interconnect features, (ii) an etch stop layer above the first layer, and (iii) a second layer (such as an interconnect layer) above the etch stop layer, wherein the first layer has a first section and a laterally adjacent second section, wherein a concentration of the impurity ions within the first section of the first layer is higher than a concentration of the impurity ions within the second section of the first layer, and wherein (i) the second layer above the etch stop layer and (ii) a section of the etch stop layer that is above the first section of the first layer are substantially free of the impurity ions, in accordance with an embodiment of the present disclosure.

Figures 1A, 1B, 1C:
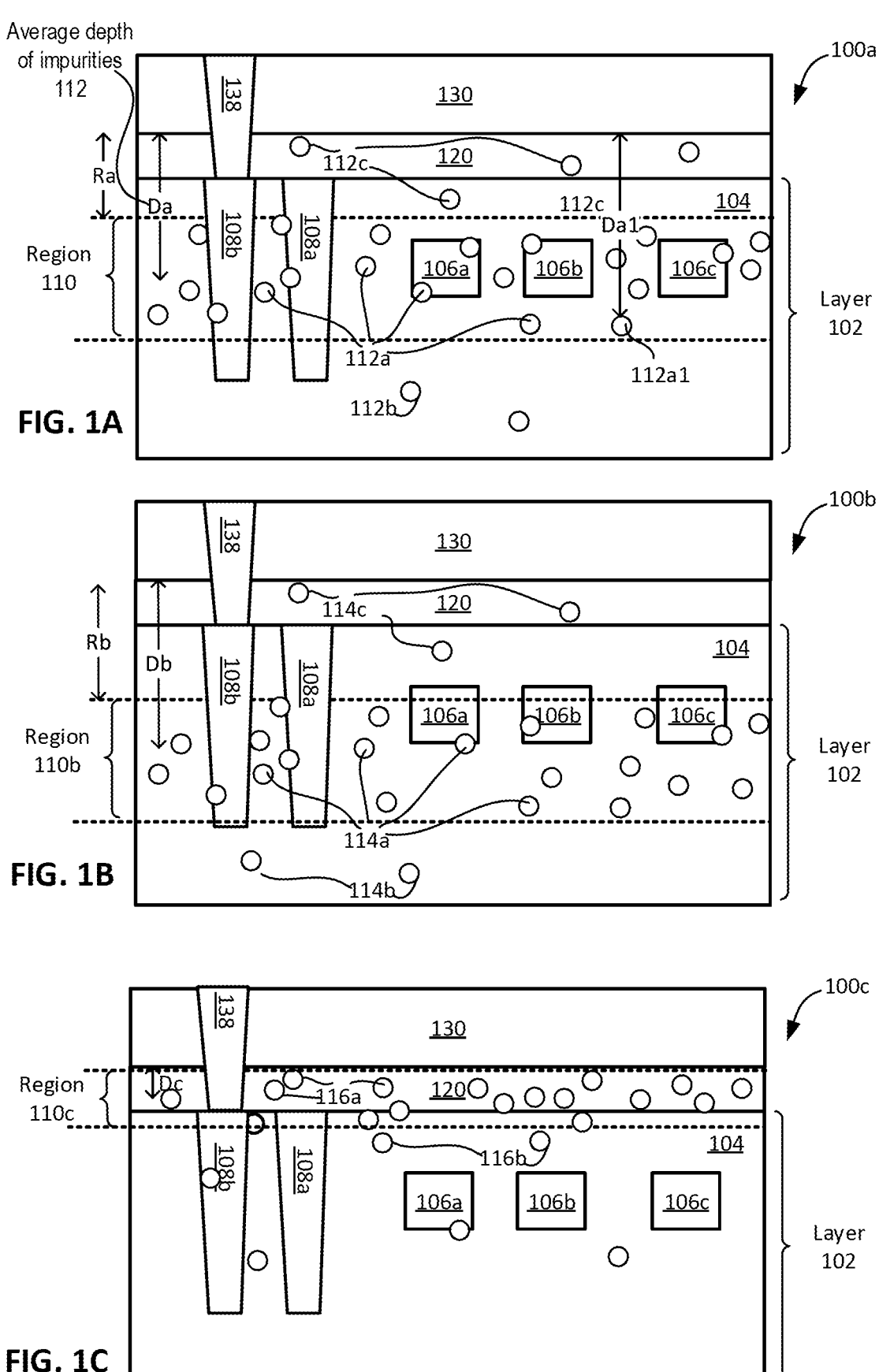
FIG. 1A illustrates a cross-sectional view of a section of an integrated circuit (IC) comprising (i) an underlayer (such as a device layer or interconnect layer) comprising a plurality of devices and one or more interconnect features, (ii) an etch stop layer above the underlayer, and (iii) another layer (such as an interconnect layer) above the etch stop layer, wherein impurity ions are implanted through the etch stop layer and within the underlayer and/or the etch stop layer, and wherein the layer above the etch stop layer is substantially free of the impurity ions, in accordance with an embodiment of the present disclosure.
FIG. 1B illustrates a cross-sectional view of a section of another IC that is at least in part similar to the IC of FIG. 1A, wherein an implant depth profile of impurity ions in the IC of FIG. 1B is different from that in the IC of FIG. 1A, in accordance with an embodiment of the present disclosure.
FIG. 1C illustrates a cross-sectional view of a section of another IC that is at least in part similar to the IC of FIG. 1A, wherein an implant depth profile of impurity ions implanted within the underlayer and/or the etch stop layer in the IC of FIG. 1C is different from that in the IC of FIG. 1A, such that a majority of the impurity ions are within the etch stop layer in the IC of FIG. 1C, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Provided herein are integrated circuit structures comprising an etch stop layer above a layer (e.g., such as a device layer or interconnect layer), where impurity ions are implanted through the etch stop layer, and within the etch stop layer and the underlying layer (or more simply, underlayer). In an example, the impurity ions are used to tune one or more characteristics of the etch stop layer and/or the underlayer, e.g., including characteristics of one or more devices within the underlayer. For example, the impurity ions are used to tune permeability, dielectric constant, wet etchability, and/or one or more other characteristics of the etch stop layer, dielectric material of the underlayer, and/or one or more devices within the underlayer. In one embodiment, an integrated circuit includes a first layer comprising dielectric material. One or both of an interconnect feature and a device are within the dielectric material of the first layer. The integrated circuit further includes a second layer above the first layer, where the second layer includes dielectric material. A third layer is between the first layer and the second layer. In an example, the third layer has a thickness between the first and second layers in the range of 0.5 to 50 nanometers. In an example, the third layer is an etch stop layer, which may also act as a passivation layer (e.g., protecting a memory or logic cell) or a barrier layer (e.g., diffusion barrier of interconnect feature) or a liner layer (e.g., source or drain liner layer). In an example, an impurity is within the first layer and the third layer. In an example, the impurity has a detectable implant depth profile such that a first distribution of the impurity is within the first layer and a second distribution of the impurity is within the third layer.

In another embodiment, an integrated circuit includes a layer including dielectric material, where the layer has a first section, and a second section laterally adjacent to the first section. An etch stop layer is above the layer. An impurity is within the first and second sections of the layer and within the etch stop layer. In an example, a distribution of the impurity within the first section of the layer is at a first average vertical distance from a top surface of the etch stop layer, and a distribution of the impurity within the second section of the layer is at a second average vertical distance from the top surface of the etch stop layer. In an example, the first average vertical distance is different (e.g., 2 or more nanometers different) from the second average vertical distance.

In yet another embodiment, a method of implanting an impurity within an integrated circuit includes forming a layer comprising dielectric material. In an example, one or both of an interconnect feature and a device are within the dielectric material of the layer. In an example, the method further includes forming an etch stop layer above at least a section of the layer. In an example, the method further includes implanting the impurity, through the etch stop layer, within the etch stop layer and layer. In an example, location selectivity of the implanted impurity can be achieved (e.g., by patterning a mask or the etch stop itself), where a first section of the layer has the impurity at a first average depth and a second section of the layer has the impurity at a second average depth, where the first depth is different (e.g., 2 or more nanometers different) from the second depth. In an example, a concentration of the impurity within the first section of the layer is different (e.g., 10% or more different) from a concentration of the impurity within the second section of the layer. Numerous variations, embodiments, and applications will be apparent in light of the present disclosure.

General Overview

As previously noted, there are nontrivial issues associated with etch stop layers. For instance, while a given etch stop may be effective at stopping an etch process along a specific location within a die, that etch stop may not have appropriate properties for desired device performance or reliability. Modifying the etch stop at time of deposition may be helpful in some instances, but the modification will only affect the etch stop itself and would be homogenous across the wafer, which may not be acceptable for all applications. For example, such etch stop modification provides no ability to modify material under etch stop, and no ability to spatially define or otherwise localize the modification.

Accordingly, techniques are provided herein to form an etch stop layer above a layer, and implant impurity ions within the etch stop layer and/or the underlying layer. In an example, the impurity ions are implanted from above the etch stop layer. In an example, the implanted impurity ions may be used to tune one or more characteristics, such as permeability, dielectric constant, wet etchability, or other properties of the etch stop layer and/or the underlayer (the one or more layers below the etch stop layer). In an example, by tuning an energy used for the ion implantation process and/or by selecting one or more characteristics of the etch stop layer (such as a density, a permeability, and/or a thickness of the etch stop layer), an average depth at which the ions are implanted can be controlled. For example, by tuning one or more of these parameters, a majority of the ions can be implanted within the etch stop layer, or a majority of the ions can be implanted within a configurable depth within the underlayer. The underlayer can be, for example, an interconnect layer composed of dielectric material and one or more interconnect features and/or devices (e.g., capacitor and transistor of memory cell), or a device layer having a plurality of transistors (e.g., metal oxide semiconductor field effect transistors, or MOSFETs) within dielectric material. In a more general sense, the underlayer can be any layer or layers under the etch stop layer. Various species can be implanted into and through the etch stop, such as carbon, helium, argon, nitrogen, to name a few example species. The implantation can be spatially controlled, for example, with the use lithography (patterned mask), in some cases. As will be appreciated in light of this disclosure, the implantation can be done before or after patterning of the etch stop.

In an example, spatial diversity in the ion implantation profile can be achieved within the underlayer and/or the etch stop layer. For example, assume that a first section of the underlayer comprises one or more devices, such as transistors (e.g., thin film transistors) of corresponding one or more memory cells (such as DRAM cells, or eDRAM cells). For example, a transistor of a memory cell is within the first section of the underlayer, and a capacitor of the memory cell is within a layer above the etch stop layer. Also assume a second section of the underlayer includes logic circuits. In an example, the implanted ions can be at a first concentration and/or at a first average depth within the first section of the underlayer, and the implanted ions can be at a second concentration and/or at a second average depth within the second section of the underlayer. Thus, spatially diverse ion implantation profile can be achieved within the underlayer, which may, for example, facilitate better tuning of the transistors and/or the logic circuits within the underlayer. Similar spatially diverse ion implantation profile can also be achieved within the etch stop layer.

In an example, the spatially diverse ion implantation profile can be achieved by using a sacrificial layer (e.g., mask) formed over a section of the etch stop layer. For example, the underlayer and the etch stop layer above the underlayer are initially formed, where the underlayer has a first section and a second section. Assume a third section of the etch stop layer is above the first section of the underlayer, and a fourth section of the etch stop layer is above the second section of the underlayer. To achieve the spatially diverse ion implantation profile, a sacrificial layer is formed above, for example, the fourth section of the etch stop layer, where the sacrificial layer is not above the third section of the etch stop layer. Subsequently, the impurity ions are implanted from above the top surface of the sacrificial layer and the top surface of the third section of the etch stop layer. Merely as an example, beamline implantation, plasma implantation, spin-on implantation, or another appropriate implantation technique can be used to implant the impurity ions. A depth at which majority of the impurity ions will be implanted depends on, for example, (i) an energy used in the ion implantation process, (ii) a density, a height, and/or a permeability of the sacrificial layer, and/or (iii) a density, a height, and/or a permeability of the etch stop layer, and the depth is a tunable by controlling one or more of the above parameters. For the impurity ions to be implanted in one or both of the fourth section of the etch stop layer and/or the second section of the underlayer, the impurity ions have to traverse through the sacrificial layer. For example, if the sacrificial layer has relatively a high vertical height (thickness), high density, and/or low permeability, relatively less impurity will reach the fourth section of the etch stop layer and/or the second section of the underlayer. On the other hand, if the sacrificial layer has relatively low vertical height, low density, and/or high permeability, relatively more impurity will reach the fourth section of the etch stop layer and/or the second section of the underlayer. Thus, concentration and average depth of the impurity ions within the fourth section of the etch stop layer and/or the second section of the underlayer is controlled by the characteristics of the sacrificial layer. On the other hand, because the sacrificial layer is absent above the third section of the etch stop layer, a majority of the impurity ions implanted from above the third section of the etch stop layer travel through the third section of the etch stop layer and are implanted within the first section of the underlayer, according to an example. Thus, impurity ions are implanted deeper within the first section of the underlayer, than a depth of the impurity ions implanted within the second section of the underlayer, thereby providing the above discussed spatial diversity in the impurity implantation profile. Note the spatial diversity may be achieved in both the vertical sense (e.g., where impurity travels deeper into one section than in other sections) as well as the horizontal sense (e.g., where impurity travels into one section but is blocked or otherwise prohibited from traveling into a laterally adjacent section).

In another example, the spatially diverse ion implantation profile can be achieved by initially forming only a part, but not the entirety, of the etch stop layer above the underlayer. For example, assume the underlayer has a first section and a second section. To achieve a spatially diverse ion implantation profile in that underlayer according to one such example, the etch stop layer is patterned or otherwise only formed above the second section of the underlayer, with no etch stop layer above the first section of the underlayer. Thus, the top surface of the first section of the underlayer is now exposed (not covered by any etch stop layer). Subsequently, the impurity ions are implanted from above the top surface of the patterned etch stop layer and the exposed first section of the underlayer. Referring to the second section of the underlayer and the etch stop layer thereabove, the impurity ions have to traverse through the etch stop layer, to reach the second section of the underlayer. On the other hand, the impurity ions are directly implanted within the first section of the underlayer, without having to initially traverse through any etch stop layer. Accordingly, impurity ions will be implanted deeper in the first section of the underlayer and at a higher concentration, e.g., compared to a depth and concentration of the impurity ions (if any) in the second section of the underlayer. This provides the spatial diversity in the impurity implantation profile within the first and second sections of the underlayer. Subsequently, the etch stop layer can be formed above the first section of the underlayer, if so desired.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect an etch stop layer above a given underlayer, where impurity ions are detected in both the etch stop layer and the underlayer. In some such embodiments, such tools may also be used to detect different concentrations of the impurity ions within different sections of the underlayer. In some such embodiments, such tools may also be used to detect different concentrations of the impurity ions within different sections of the etch stop layer. Numerous configurations and variations will be apparent in light of this disclosure.

Architecture and Methodology

FIG. 1A illustrates a cross-sectional view of a section of an integrated circuit (IC) 100a comprising (i) an underlayer 102 (such as a device layer or interconnect layer that is below an etch stop layer) comprising a plurality of devices 106a, 106b, 106c and one or more interconnect features 108a, 108b, (ii) an etch stop layer 120 above the under layer 102, and (iii) another layer 130 (such as an interconnect layer 130) above the etch stop layer 120, wherein impurity ions are implanted through the etch stop layer 120 and within the underlayer 102 and/or the etch stop layer 120, and wherein the layer 130 above the etch stop layer 120 is substantially free of the impurity ions, in accordance with an embodiment of the present disclosure.

The underlayer 102 (also referred to herein as layer 102) can be, for example, an interconnect layer composed of dielectric material and one or more interconnect features and/or devices (e.g., capacitor and/or transistor of memory cell), or a device layer having a plurality of transistors (e.g., metal oxide semiconductor field effect transistors, or MOS-FETs) within dielectric material. In a more general sense, the underlayer can be any layer or layers under the etch stop layer. In an example, the layer 102 comprises a plurality of active and/or passive devices 106a, 106b, 106c, which may be transistors, resistors, capacitors, inductors, and/or any appropriate component(s) present in an IC. In an example, the devices 106 are within dielectric material 104 of the layer 102. Although merely three devices 106a, 106b, 106c are illustrated, in an example, many more such devices may be present within the layer 102. The devices 106 are symbolically illustrated using rectangular boxes, although actual shape and/or location of the devices 106 are different from those illustrated in FIG. 1A.

In an example, the devices 106a, 106b, 106c are transistors. For example, the devices 106a, 106b, 106c are transistors (such as thin film transistors or TFT) used to form memory cells, such as dynamic random access memory (DRAM) cells, e.g., embedded DRAM (eDRAM) cells. For example, each transistor 106 is coupled to a corresponding capacitor (not illustrated, which may be within the layer 130 or within the layer 102), and the transistor and the capacitor, in combination, form or is part of a DRAM (such as eDRAM) cell.

Also illustrated in FIG. 1A are example interconnect features 108a, 108b that extend within the layer 102. Although merely two interconnect features 108a, 108b are illustrated, several such interconnect features may extend within the layer 102. Each interconnect feature 108 is a conductive via or a conductive line comprising conductive material, used for signal and/or power routing in the IC 100a.

As illustrated, the layer 130 above the etch stop layer 120 includes one or more interconnect features, such as the interconnect feature 138. In the example of FIG. 1A, the interconnect feature 138 is conductively coupled to the interconnect feature 108b. For example, the interconnect feature 138 extends through the layer 130 and the etch stop layer 120, to contact the interconnect feature 108b.

Although not illustrated in FIG. 1A, the layer 130 may include one or more components, such as one or more additional interconnect features, and/or one or more active and/or passive components. For example, as discussed herein above, at least one of the components 106 is a transistor, and a corresponding capacitor may be within the layer 130, such that the transistor and the capacitor, in combination, form or is part of a DRAM (such as eDRAM) cell.

In one embodiment, the etch stop layer 120 acts to stop an etching process within the layer 130, e.g., to form one or more recesses (not illustrated in FIG. 1A) within the layer 130 that stops at the etch stop layer 120. In an example, the etch stop layer 120 also acts as a liner or encapsulation layer on a top surface of the interconnect features 108a, 108b. For example, the etch stop layer 120 prevents or reduces conductive material (e.g., copper) of the interconnect features 108a, 108b from diffusing into the dielectric material of the layer 130.

In an example, the etch stop layer 120 has a thickness between the layers 130 and 102 in the range of 0.5 to 50 nanometers (nm), such as in the range of 1 to 20 nm, or 1 to 10 nm, or 2 to 8 nm, or 4 to 6 nm. The etch stop layer comprises an appropriate dielectric material, such as an appropriate oxide, nitride, carbide, or another appropriate dielectric material used for an etch stop layer. In an example, the etch stop layer 120 is etch selective to the layer 130. For example, an etch process to etch the layer 130 may not substantially etch the etch stop layer 120.

In one embodiment, impurity ions 112 are implanted within the etch stop layer 120 and the layer 102. For example, as will be discussed herein later, the impurity ions 112 are implanted from above the etch stop layer 120, prior to formation of the layer 130 and the interconnect feature 138. Accordingly, the layer 130 and the interconnect feature 138 are substantially free of the impurity ions 112.

FIG. 1A and various subsequent figures herein symbolically illustrate the impurity ions with small circles, although the impurity ions need not be circular in shape. Furthermore, a few such circles are illustrated, and the number of circles within a section is somewhat indicative of relative impurity concentration within the section, but is not indicative of actual impurity concentration within the layer. For example, FIG. 1A illustrates a smaller number of circles within the etch stop layer 120 and a greater number of circles within region 110 of the layer 102, implying that the etch stop layer 120 has a lower impurity concentration than that in the region 110.

In the example of FIG. 1A, the impurity ions 112 are implanted within the layer 102 and/or the etch stop layer 120, through the etch stop layer 120. In one embodiment, the impurity ions 112 are implanted using an ion implantation process, and any appropriate technique for implantation of the impurity ions may be used. Merely as an example, beamline implantation, plasma implantation, spin-on implantation, and/or another appropriate implantation technique can be used to implant the impurity ions 112.

In an example, based on one or more parameters of the process for implanting the impurity ions, the impurity ions 112 are implanted with a detectable implant depth profile, such that a first distribution of the impurity ions 112 is within the layer 102 and a second distribution of the impurity ions 112 is within the etch stop layer 120.

For example, impurity ions are implanted with an average depth of Da, as illustrated in FIG. 1A. For example, FIG. 1A illustrates a depth Da1 of a specific impurity ion 112a1. Such depth of individual impurity ions can be averaged, to estimate the average depth Da of the impurity ions 112. In an example, a top surface of the region 110, which includes a majority of the impurity ions 112, is at a depth Ra from a top surface of the etch stop layer 120.

The average depth Da and the depth Ra of the region 110 are based on, for example, an energy used during the ion implantation process to implant the impurity ions. The higher the energy, the more are the depths Da and Ra, where the depths are measured from a top surface of the etch stop layer 120.

In an example, the impurity ions 112 are implanted through the etch stop layer 120. That is, the impurity ions have to traverse through the etch stop layer 120, to reach and be implanted within the layer 102. Accordingly, in an example, the average depth Da and/or the depth Ra is also based on a density, permeability, and/or vertical height (or another appropriate characteristics) of the etch stop layer 120. For example, if the etch stop layer 120 is less dense, more permeable, and/or has relatively less height, the impurity ions may relatively easily pass through the etch stop layer 120, resulting in a relatively higher value of the average depth Da and/or a relatively higher value of the depth Ra of a top surface of the region 110. On the other hand, if the etch stop layer 120 is more dense, less permeable, and/or has relatively more height, the impurity ions may relatively not easily pass through the etch stop layer 120, resulting in a relatively lower value of the average depth Da and/or a relatively lower value of the depth Ra of the top surface of the region 110, as will be appreciated.

In an example, depths of the impurity ions 112 are in accordance with a probability distribution, such as a Gaussian probability distribution, e.g., depending on the ion implantation technique used to implant the impurity ions 112. In an example, a majority (e.g., at least 60%, or at least 70%, or at least 80%, or at least 90%, or at least 95%, or at least 98%) of the impurity ions 112a are confined within the region 110, where in the example of FIG. 1A the region 110 is within the layer 102.

As with a probability distribution function, some impurity ions 112 will be outside the region 110. For example, a minority (e.g., at most 40%, or at most 30%, or at most 20%, or at most 10%, or at most 5%, or at most 2%) of the impurity ions 112 are outside the region 110, such as impurity ions 112b below the region 110, and impurity ions 112c above the region 110. In an example, at least some of the impurity ions 112c that are above the region 110 are within the etch stop layer 120, and some are above the region 110 but within the layer 102, as illustrated in FIG. 1A.

Thus, the impurity ions 112 are within the layer 102 and the etch stop layer 120, where the impurity ions 112 having detectable implant depth profile such that a first distribution of the impurity ions 112a is within the layer 102 and a second distribution of the impurity ions 112c is within the etch stop layer 120. As discussed, the first distribution of the impurity ions 112 includes a relatively higher concentration of the impurity ions in the layer 102, and the second distribution of the impurity ions 112 includes a relatively lower concentration of the impurity ions in the etch stop layer 120.

In one embodiment, any appropriate species of impurity ions may be implanted within the layer 102 and/or within the etch stop layer 120, such as carbon, helium, argon, nitrogen, and/or one or more other appropriate species of impurity ions that may be implanted within the layer 102 and/or the etch stop layer 120. In one embodiment, the impurity ions 112 serve one or more purposes within the IC 100a, such as alter permeability, dielectric constant, wet etchability, and/or one or more other characteristics of the etch stop layer 120 and/or the layer 102 (including the devices 106). Thus, in an example, characteristics of the etch stop layer 120 and/or the layer 102, including one or more of the devices 106, may be altered by implanting the impurity ions 112 through the etch stop layer 120.

For example, as will be discussed in turn with respect to FIG. 1D, a device 106 may be a transistor structure (e.g., TFT or MOSFET) comprising a source region, a drain region, a channel region or layer, and a gate structure. The impurity ions 112 may be implanted, for example, to tune one or more electrical properties of the transistor structures. For example, by controlling a depth of the implantation, the impurity ions 112 may be implanted within one or more specific regions (such as channel layers, or source or drain regions) of the transistor structures, to tune one or more electrical properties of the transistor structures. For example, capacitance, resistance (or inversely conductivity), or other transistor parameter can be tuned, by implanting the impurities within specific regions of the transistor structures. Some example transistor parameters that may be controlled by the impurities include threshold voltage, sub-threshold slope or swing, transistor on-current, transistor off-current, transistor contact resistance, and/or other transistor parameter. Additionally, or alternatively, the impurity ions 112 may also be implanted within the etch stop layer 120 and/or the dielectric material of the layer 102, e.g., to control permeability, dielectric constant, wet etchability, and/or one or more other characteristics of the etch stop layer 120 and/or the layer 102.

FIG. 1B illustrates a cross-sectional view of a section of another IC 100b that is at least in part similar to the IC 100a of FIG. 1A, wherein an implant depth profile of impurity ions 114 implanted within the layer 102 and/or the etch stop layer 120 in the IC 100b of FIG. 1B is different from that in the IC 100a of FIG. 1A, in accordance with an embodiment of the present disclosure. Similar components within the IC 100a of FIGS. 1A and 1C 100b of FIG. 1B are labelled using similar labels, and discussion of various components with respect to FIG. 1A, unless otherwise mentioned or contradictory in nature, are also applicable to FIG. 1B.

In FIG. 1B, impurity ions 114 are implanted within the etch stop layer 120 and the layer 102, e.g., are implanted from above the etch stop layer 120. In the example of FIG. 1B, impurity ions 114 are implanted with an average depth of DB, and primarily within a region 110b, where a top surface of the region 110b is at a depth Rb from the top surface of the etch stop layer 120. Note that the depths Db and Rb of FIG. 1B are more than corresponding depths Da and Ra of FIG. 1. Accordingly, in an example, higher ion implantation energy is used to implant the impurity ions 114 in the IC 100b of FIG. 1B, compared to that used in the IC 100a of FIG. 1A. Alternatively, or additionally, a density of the etch stop layer 120 in the IC 100b of FIG. 1B is less (e.g., compared to that in the IC 100a of FIG. 1A), due to which the impurity ions 114 are implanted at a higher depth in the IC 100b of FIG. 1B, compared to that of the IC 100a of FIG. 1A. Alternatively, or additionally, a permeability of the etch stop layer 120 in the IC 100b of FIG. 1B is more (e.g., compared to that in the IC 100a of FIG. 1A), due to which the impurity ions 114 are implanted at a higher depth in the IC 100b of FIG. 1B, compared to that of the IC 100a of FIG. 1A.

Similar to the IC 100 of FIG. 1A, in the IC 100b of FIG. 1B, depths of the impurity ions 114 are in accordance with a probability distribution, such as a Gaussian probability distribution, e.g., depending on the exact ion implantation technique used to implant the impurity ions 114. In an example, a majority (e.g., at least 60%, or at least 70%, or at least 80%, or at least 90%, or at least 95%, or at least 98%) of the impurity ions 114a are confined within the region 110b. A minority (e.g., at most 40%, or at most 30%, or at most 20%, or at most 10%, or at most 5%, or at most 2%) of the impurity ions 114 are outside the region 110b, such as impurity ions 114b below the region 110b, and impurity ions 114c above the region 110b. In an example, at least some of the impurity ions 114c that are above the region 110 are within the etch stop layer 120, as illustrated in FIG. 1B.

FIG. 1C illustrates a cross-sectional view of a section of another IC 100c that is at least in part similar to the IC 100a of FIG. 1A, wherein an implant depth profile of impurity ions 116 implanted within the layer 102 and/or the etch stop layer 120 in the IC 100c of FIG. 1C is different from that in the IC 100a of FIG. 1A, such that a majority of the impurity ions 116 are within the etch stop layer 120, in accordance with an embodiment of the present disclosure. Similar components within the IC 100a of FIGS. 1A and 1C 100c of FIG. 1C are labelled using similar labels, and discussion of various components with respect to FIG. 1A, unless otherwise mentioned or contradictory in nature, are also applicable to FIG. 1C.

In FIG. 1C, impurity ions 116 are implanted within the etch stop layer 120 and the layer 102, e.g., are implanted from above the etch stop layer 120. In the example of FIG. 1C, impurity ions 116 are implanted with an average depth of DC and primarily within a region 110c. In an example, a top surface of the region 110c substantially coincides with a top surface of the etch stop layer 120. The depth Dc of FIG. 1C is less than the depth Da of FIG. 1 and the depth Db of FIG. 1B. Accordingly, in an example, lower ion implantation energy is used to implant the impurity ions 116 in the IC 100c of FIG. 1C, compared to that used in the IC 100a of FIG. 1A. Alternatively, or additionally, a density of the etch stop layer 120 in the IC 100c of FIG. 1C is more (e.g., compared to that in the IC 100a of FIG. 1A), due to which the impurity ions 116 are implanted at a lower depth in the IC 100c of FIG. 1C, compared to that of the IC 100a of FIG. 1A. Alternatively, or additionally, a permeability of the etch stop layer 120 in the IC 100c of FIG. 1C is less (e.g., compared to that in the IC 100a of FIG. 1A), due to which the impurity ions 116 are implanted at a lower depth in the IC 100c of FIG. 1C, compared to that of the IC 100a of FIG. 1A. Accordingly, in an example, a majority of the impurity ions 116 (e.g., at least 60%, or at least 70%, or at least 80%, or at least 90%, or at least 95%, or at least 98%) are within the etch stop layer 120, in the example of FIG. 1C.

Figure 2A:
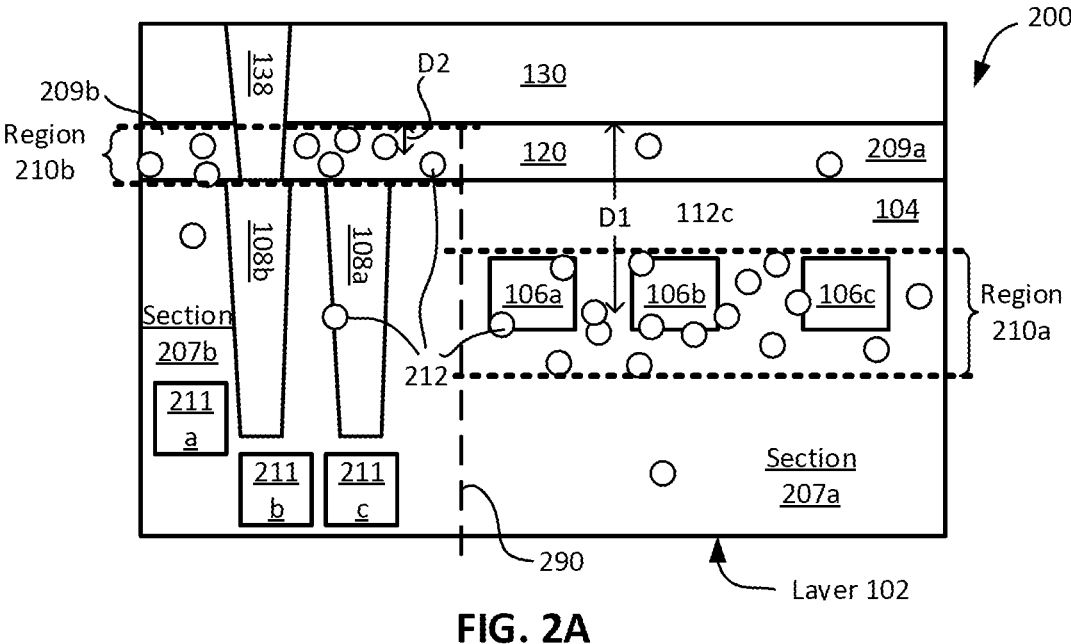
FIG. 2A illustrates a cross-sectional view of a section of an IC comprising (i) a first layer comprising a plurality of devices and one or more interconnect features, (ii) an etch stop layer above the first layer, and (iii) a second layer (such as an interconnect layer) above the etch stop layer, wherein the first layer has a first section and a laterally adjacent second section, and impurity ions are implanted through the etch stop layer and within the first layer and/or the etch stop layer, such that a concentration of the impurity ions within the first section of the first layer is higher than a concentration of the impurity ions within the second section of the first layer, and wherein the second layer above the etch stop layer is substantially free of the impurity ions, in accordance with an embodiment of the present disclosure.

FIG. 2A illustrates a cross-sectional view of a section of an IC 200 comprising (i) a first layer 102 comprising a plurality of devices 106a, 106b, 106c, 211a, 211b, 211c and one or more interconnect features 108a, 108b, (ii) an etch stop layer 120 above the first layer 102, and (iii) a second layer 130 (such as an interconnect layer 130) above the etch stop layer 120, wherein the first layer 102 has a first section 207a and a laterally adjacent second section 207b, and impurity ions 212 are implanted through the etch stop layer 120 and within the first layer 102 and/or the etch stop layer 120, such that a concentration of the impurity ions 212 within the first section 207a is higher than a concentration of the impurity ions 212 within the second section 207b, and wherein the second layer 130 above the etch stop layer 120 is substantially free of the impurity ions 212, in accordance with an embodiment of the present disclosure.

Similar components within the IC 100a of FIGS. 1A and 1C 200 of FIG. 2A are labelled using similar labels, and discussion of various components with respect to FIG. 1A, unless otherwise mentioned or contradictory in nature, are also applicable to FIG. 2A.

In FIG. 2A, the layer 102 is divided in two sections: 207a and 207b. For example, an imaginary line 290 (which is a plane in the 3-dimensional IC 200) passing vertically through the layer 102 divides the layer 102 in the two sections. Section 207a comprises the devices 106a, 106b, 106c. In an example, the interconnect features 108a, 108b are within the section 207b, as illustrated in FIG. 2A. In another example and although not illustrated in FIG. 2A, one or more of the interconnect features 108a, 108b are within the section 207a.

In an example, devices 106a, 106b, 106c of section 207a are transistors, such as thin film transistors (TFT). In an example, each transistor 106a and a corresponding capacitor (not illustrated, which may be within the layer 102 or within the layer 130) form, or otherwise be a part of, a memory cells, such as a DRAM (e.g., eDRAM) memory cell, as previously discussed herein.

In an example, section 207*b* comprises devices 211*a*, 211*b*, 211*c*, which may be any appropriate active and/or passive devices, such as transistors, capacitors, resistors, and/or inductors. In an example, one or more of the devices 211*a*, 211*b*, 211*c* are transistors that form logic circuits (e.g., sense amplifier, word line selector, bit line selector, or other appropriate logic circuits) for the DRAM memory cells.

Thus, in an example, TFTs of one or more DRAM (e.g., eDRAM) memory cells are within the section 207*a*, and one or more logic circuits are within the section 207*b*. The section 207*a* is also referred to herein as a memory section, and the section 207*b* is also referred to herein as a logic circuit section of a memory array.

In one embodiment, the etch stop layer 120 is also divided in two sections: section 209*a* of the etch stop layer 120 that is above the section 207*a* of the layer 102, and section 209*b* of the etch stop layer 120 that is above the section 207*b* of the layer 102. For example, the imaginary line 290 (which is a plane in the 3-dimensional IC 200) passing vertically through the etch stop layer 120 divides the etch stop layer 120 in the two sections.

In FIG. 2A, impurity ions 212 are implanted within the etch stop layer 120 and the layer 102, e.g., are implanted from above the etch stop layer 120. In the example of FIG. 2A, impurity ions 212 are implanted with location selectivity. For example, referring to the section 207*a* of the layer 102 and the section 209*a* of the etch stop layer 120 (where the section 209*a* is above the section 207*a*), the implanted impurity ions 212 are mostly within a region 210*a* that is within the section 207*a*, as illustrated. For example, the region 210*a* encompasses at least part of one or more of the devices 106. For example, referring to sections 207*a* and 209*a* on the right side of the IC 200, a majority of the impurity ions 212 implanted on the right side of the IC 200 (e.g., at least 60%, or at least 70%, or at least 80%, or at least 90%, or at least 95%, or at least 98%) are within the region 210*a* within the section 207*a*, and a minority of the impurity ions 212 (e.g., at most 40%, or at most 30%, or at most 20%, or at most 10%, or at most 5%, or at most 2%) implanted on the right side of the IC 200 are within the section 209*a*. For example, an average depth of the impurity ions implanted on the right side of the IC 200 is D1, as illustrated in FIG. 2A. Thus, at least some of the impurity ions 212 are within, or adjacent to, the devices 106.

Referring now to the section 207*b* of the layer 102 and the section 209*b* of the etch stop layer 120 (where the section 209*b* is above the section 207*b*) on the left side of the IC 200, the impurity ions 212 implanted on the left side of the IC 200 are mostly within a region 210*b* that is at least in part within the section 209*b* of the etch stop layer 120, as illustrated. For example, referring to sections 207*b* and 209*b*, a majority of the impurity ions 212 (e.g., at least 60%, or at least 70%, or at least 80%, or at least 90%, or at least 95%, or at least 98%) implanted on the left side of the IC 200 are within the region 210*b* that is at least in part within the section 209*a* of the etch stop layer 120, and a minority of the impurity ions 212 (e.g., at most 40%, or at most 30%, or at most 20%, or at most 10%, or at most 5%, or at most 2%) implanted on the left side of the IC 200 are within the section 207*b* of the layer 120. For example, an average depth of the impurity ions is D2, as illustrated in FIG. 2A. In the example of FIG. 2A, the depth D2 is less than the depth D1.

Figure 1D:
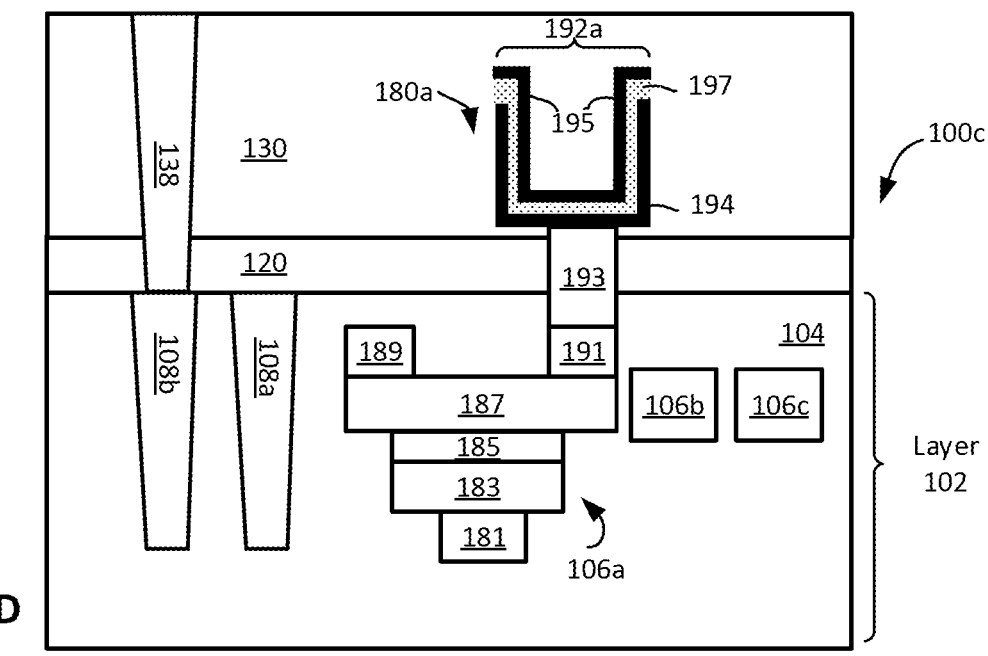
FIG. 1D illustrates a device of the plurality of devices within the underlayer (such as a device layer or interconnect layer that is below an etch stop layer) included in any one or more of the ICs discussed herein, in accordance with an embodiment of the present disclosure.

FIG. 1D illustrates an example device 106*a* of the plurality of devices 106*a*, 106*b*, 106*c* within the underlayer 102 (such as a device layer or interconnect layer that is below an etch stop layer) included in any one or more of the ICs discussed herein, in accordance with an embodiment of the present disclosure. As previously discussed herein, in an example, the device 106*a* is a transistor, such as a thin film transistor or TFT, used to form memory cells, such as DRAM cells, e.g., embedded DRAM (eDRAM) cells. For example, the transistor 106*a* is coupled to a corresponding capacitor 192*a* within the layer 130, and the transistor 106*a* and the capacitor 192*a*, in combination, form or are part of a DRAM (such as eDRAM) cell 180*a*.

In a memory cell, such as the memory cell 180*a* for example, the capacitor 192*a* stores a bit of information and the transistor 106*a* allows for writing and reading that bit. For example, the capacitor 192*a* can either be charged to a first state or discharged to a second state, and these two states represent two possible bit values of 0 or 1. As illustrated in FIG. 1D, the capacitor 192*a* comprise electrodes 194 and 195. In the example of FIG. 1D, the electrode 194 is below the electrode 195. Accordingly, the electrodes 194, 195 are also referred to herein as lower electrode and upper electrode of the capacitor, respectively, due to their relative positions. In other embodiments, capacitor 192*a* may have a different shape or configuration. For instance, rather than being U-shaped, capacitor 192*a* may have a relatively flat configuration with upper and lower electrodes, or a pillar-shaped configuration with inner and outer electrodes. In one embodiment, the electrodes 194, 195 may include any suitable electrically conductive material, such as a metal or metal alloy material including, e.g., copper, silver, aluminum, tantalum (Ta), aluminum (Al), tungsten (W), nickel (Ni), platinum (Pt), molybdenum (Mo), manganese (Mn), or an alloy thereof, such as titanium nitride (TiN), tantalum nitride (TaN), titanium aluminum nitride (TiAlN), molybdenum oxide (MoO2), manganese oxide (MnO2), ruthenium, tungsten oxide (WO2), or another appropriate conductive material.

As can be further seen, one or more layers 197 is between the electrode 195 and the electrode 194. The one or more layers 197 comprise dielectric material and form the "I" part of the MIM (metal-insulator-metal) capacitor 192*a*. Note that the layers 197 may comprise one or more distinct and/or compositionally different layers of dielectric material. For example, the layers 197 may comprise one or more thin films of one or more metal oxides, such as one or more oxides of hafnium (Hf), aluminum (Al), zirconium (Zr), titanium (Ti), tantalum (Ta), or another appropriate metal.

The transistor 106*a* within the layer 102 may have a number of configurations. In an example, the transistors 106 are TFTs, while in some other examples transistors 106 may be metal oxide semiconductor field effect transistors (MOSFETs). In an example, the layer 102 including the transistors 106 are formed at BEOL (back end of line) process during formation of the IC, above or below a previously formed device layer that includes, for example, logic transistors, input/output (I/O) transistors, and/or radio frequency transistors (RF).

In an example, transistor 106*a* has a bottom-gate TFT configuration, where the source and drain terminals are above the transistor, and the gate terminal is below the transistor. In an example, the transistor 106*a* includes a gate electrode 183, which in some examples is coupled, for instance, to a word line of the memory cell 180*a* through a gate contact 181. In an example, the transistor 106*a* comprises a channel layer 187. The gate electrode 183 is below the channel layer 187. A first source or drain region 189 and a second source or drain region 191 are above the channel layer 187. A gate dielectric layer 185, e.g., a high-k layer, is located between the channel layer 187 and the gate electrode 183.

In an example, the channel layer 187 may include one or more of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si2BN, stanene, phosphorene, molybdenite, poly-III-V like indium arsenide (InAs), indium gallium arsenide (InGaAs), indium phosphide (InP), amorphous indium gallium zinc oxide (InGaZnO, sometimes referred to as a-IGZO), crystal-like InGaZnO (c-IGZO), gallium zinc oxynitride (GaZnON), zinc oxynitride (ZnON), molybdenum and sulfur, a group-VI transition metal dichalcogenide, and a c-axis aligned crystal (CAAC) layer.

In an example, the first source or drain region 189 may be coupled to, for example, a bit line of the memory cell 180a. In the example shown, the second source or drain region 191 is coupled to the lower electrode 194 of the capacitor 192a of the memory cell 180a, e.g., through a source or drain contact 191, and a conductive interconnect feature 193 that extends through the etch stop layer 120. The source or drain contacts and/or the conductive structure 193 may include, for example, one or more of titanium (Ti), molybdenum (Mo), gold (Au), platinum (Pt), aluminum (Al), nickel (Ni), copper (Cu), chromium (Cr), hafnium (Hf), indium (In), ruthenium (Ru), and an alloy of Ti, Mo, Au, Pt, Al, Ni, Cu, Cr, Ru, TiAlN, HfAlN, InOx, HfOx, AlOx, or InAlO.

As discussed with respect to FIGS. 1A-1C and as also will be discussed herein later with respect to FIGS. 2A-9D, impurity ions are implanted within the layer 102, e.g., within and/or in vicinity of the devices 106a, 106b, 106c. For example, impurity ions may be implanted within and/or in vicinity of the device 106a of FIG. 1D.

Figure 2B:
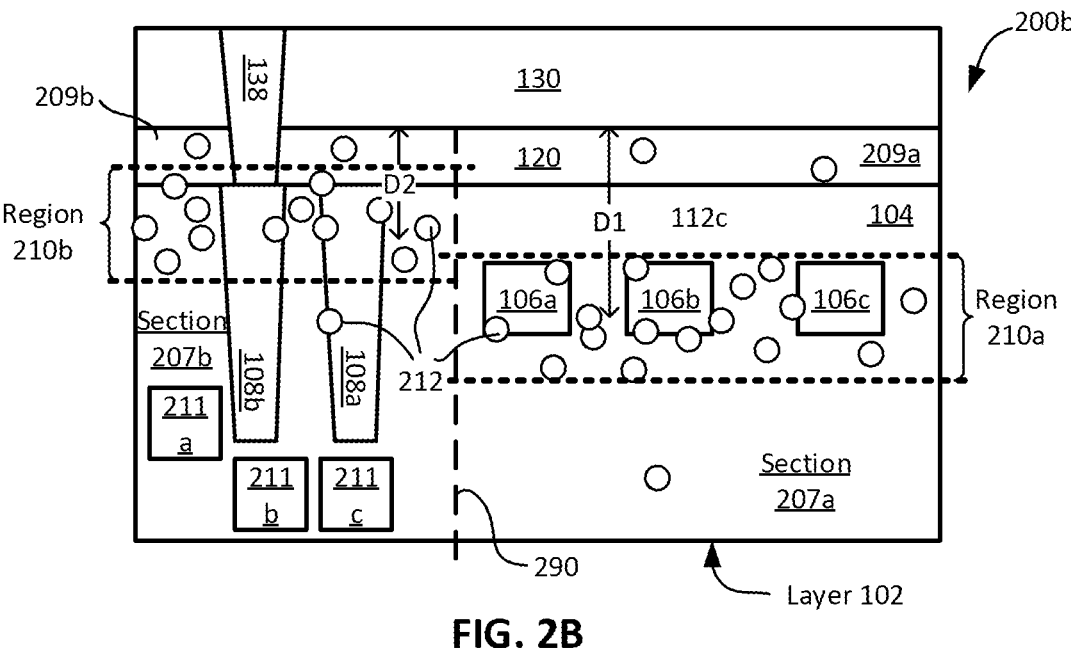
FIG. 2B illustrates a cross-sectional view of a section of an IC comprising (i) a first layer comprising a plurality of devices and one or more interconnect features, (ii) an etch stop layer above the first layer, and (iii) a second layer (such as an interconnect layer) above the etch stop layer, wherein the first layer has a first section and a laterally adjacent second section, and impurity ions are implanted through the etch stop layer and within the first layer and/or the etch stop layer, such that an average depth of the impurity ions within the first section of the first layer is higher than an average depth of the impurity ions within the second section of the first layer, and wherein the second layer above the etch stop layer is substantially free of the impurity ions, in accordance with an embodiment of the present disclosure.

FIG. 2B illustrates a cross-sectional view of a section of an IC 200b comprising (i) a first layer 102 comprising a plurality of devices 106a, 106b, 106c, 211a, 211b, 211c and one or more interconnect features 108a, 108b, (ii) an etch stop layer 120 above the first layer 102, and (iii) a second layer 130 (such as an interconnect layer 130) above the etch stop layer 120, wherein the first layer 102 has a first section 207a and a laterally adjacent second section 207b, and impurity ions 212 are implanted through the etch stop layer 120 and within the first layer 102 and/or the etch stop layer 120, such that an average depth of the impurity ions 212 within the first section 207a is higher than an average depth of the impurity ions 212 within the second section 207b, and wherein the second layer 130 above the etch stop layer 120 is substantially free of the impurity ions 212, in accordance with an embodiment of the present disclosure.

The IC 200b of FIG. 2B is at least in part similar to the IC 200 of FIG. 2A, and similar components within the IC 200 of FIG. 2A and IC 200b of FIG. 2B are labelled using similar labels. Discussion of various components with respect to FIG. 2A, unless otherwise mentioned or contradictory in nature, are also applicable to FIG. 2B.

However, unlike the IC 200 of FIG. 2A where the section 207b of the layer 102 has a low concentration of the impurity ions (e.g., lower compared to a concentration of the impurity ions within the section 209b of the etch stop layer 120), in the IC 200b of FIG. 2B, the section 107b now has a relatively higher concentration of impurity ions (e.g., compared to that in the section 209b of the etch stop layer 120). For example, the region 210b in FIG. 2B has a majority of the impurity ions of the left side of the IC 200b, where the region 210b is at least in part within the section 210b, although at a lower depth than a depth of the region 210a. As illustrated, the average depth D1 of the impurity ions within the right side of the IC 200b is higher than the average depth D2 of the impurity ions within the left side of the IC 200b.

Figure 2C:
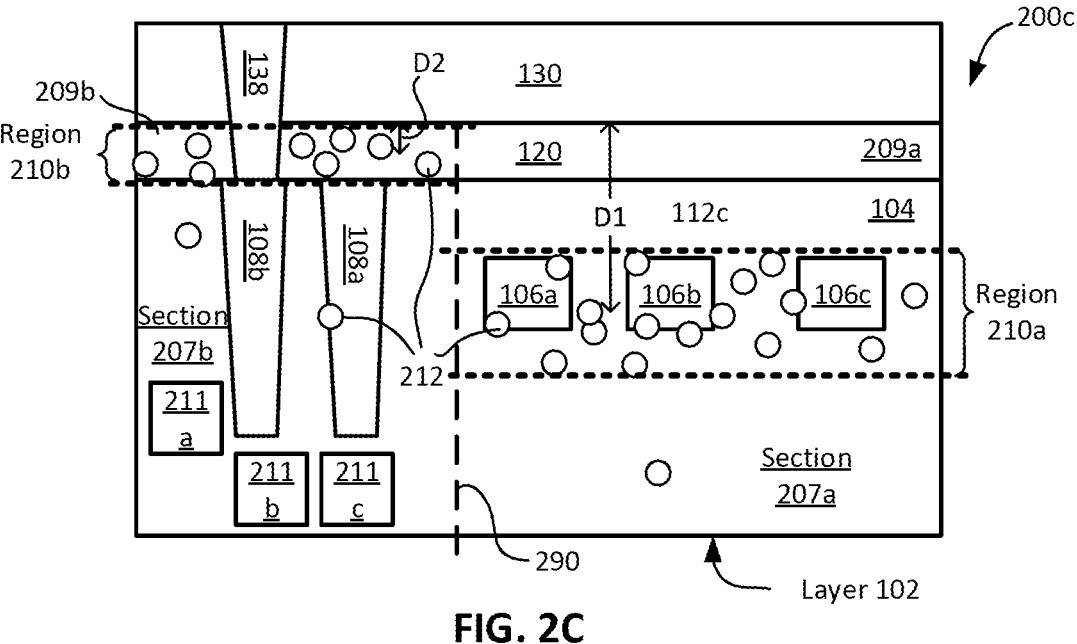
FIG. 2C illustrates a cross-sectional view of a section of an IC comprising (i) a first layer comprising a plurality of devices and one or more interconnect features, (ii) an etch stop layer above the first layer, and (iii) a second layer (such as an interconnect layer) above the etch stop layer, wherein the first layer has a first section and a laterally adjacent second section, wherein a concentration of the impurity ions within the first section of the first layer is higher than a concentration of the impurity ions within the second section of the first layer, and wherein (i) the second layer above the etch stop layer and (ii) a section of the etch stop layer that is above the first section of the first layer are substantially free of the impurity ions, in accordance with an embodiment of the present disclosure.

FIG. 2C illustrates a cross-sectional view of a section of an IC 200c comprising (i) a first layer 102 comprising a plurality of devices 106a, 106b, 106c, 211a, 211b, 211c and one or more interconnect features 108a, 108b, (ii) an etch stop layer 120 above the first layer 102, and (iii) a second layer 130 (such as an interconnect layer 130) above the etch stop layer 120, wherein the first layer 102 has a first section 207a and a laterally adjacent second section 207b, wherein a concentration of the impurity ions 212 within the first section 207a is higher than a concentration of the impurity ions 212 within the second section 207b, and wherein (i) the second layer 130 above the etch stop layer 120 and (ii) a section 209a of the etch stop layer 120 that is above the first section 207 of the first layer 102 are substantially free of the impurity ions 212, in accordance with an embodiment of the present disclosure.

The IC 200c of FIG. 2C is at least in part similar to the IC 200 of FIG. 2A, and similar components within the IC 200 of FIG. 2A and IC 200c of FIG. 2C are labelled using similar labels. Discussion of various components with respect to FIG. 2A, unless otherwise mentioned or contradictory in nature, are also applicable to FIG. 2C.

However, unlike the IC 200 of FIG. 2A where the section 209a of the etch stop layer 120 has a low concentration of the impurity ions (e.g., lower compared to a concentration of the impurity ions within the section 207a), the section 209a of the etch stop layer 120 in the IC 200c of FIG. 2C is substantially free of impurity ions. For example, as will be discussed in further detail with respect to FIGS. 8 and 9C-9D, the section 209a of the etch stop layer 120 is formed after implantation process for implanting the impurity ions, and hence, this section 209a is substantially free of the impurity ions.

Figure 3:
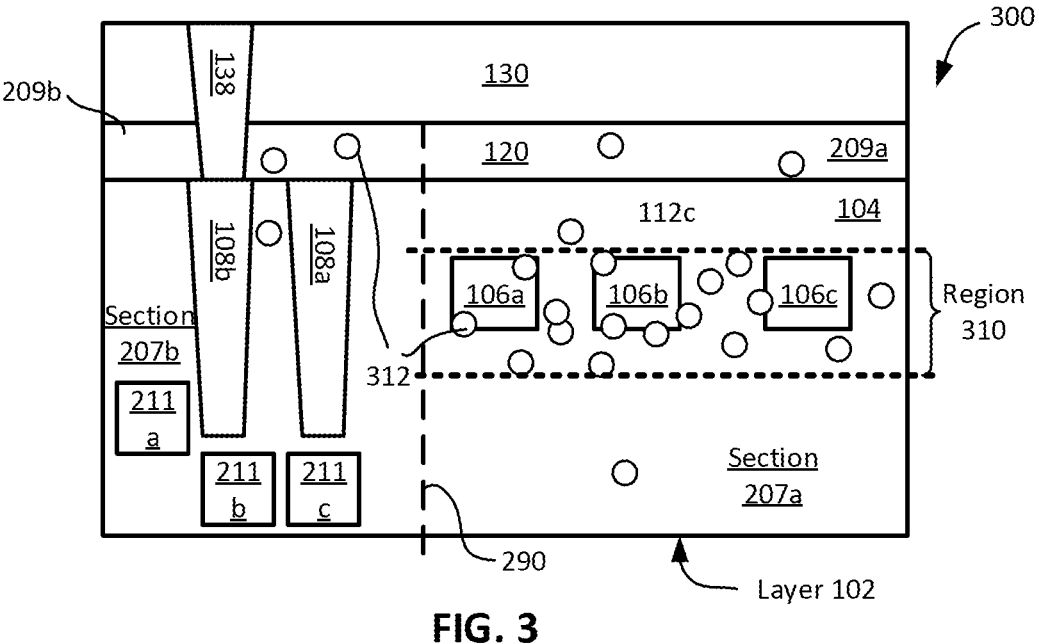
FIG. 3 illustrates a cross-sectional view of a section of an IC comprising (i) a first layer comprising a plurality of devices and one or more interconnect features, (ii) an etch stop layer above the first layer, and (iii) a second layer (such as an interconnect layer) above the etch stop layer, wherein the first layer has a first section and a laterally adjacent second section, and impurity ions are implanted through the etch stop layer and within the first layer and/or the etch stop layer, such that a concentration of the impurity ions within the first section of the first layer is higher than a concentration of the impurity ions within the second section of the first layer, and wherein the second section of the first layer is substantially free of impurity ions, in accordance with an embodiment of the present disclosure.

FIG. 3 illustrates a cross-sectional view of a section of an IC 300 comprising (i) a first layer 102 comprising a plurality of devices 106a, 106b, 106c, 211a, 211b, 211c and one or more interconnect features 108a, 108b, (ii) an etch stop layer 120 above the first layer 102, and (iii) a second layer 130 (such as an interconnect layer 130) above the etch stop layer 120, wherein the first layer 102 has a first section 207a and a laterally adjacent second section 207b, and impurity ions 312 are implanted through the etch stop layer 120 and within the first layer 102 and/or the etch stop layer 120, such that a concentration of the impurity ions 312 within the first section 207a is higher than a concentration of the impurity ions 312 within the second section 207b, and wherein the second section 207b is substantially free of impurity ions, in accordance with an embodiment of the present disclosure.

Similar components within the IC 200 of FIG. 2A and IC 300 of FIG. 3 are labelled using similar labels, and discussion of various components with respect to FIGS. 1A and 2A, unless otherwise mentioned or contradictory in nature, are also applicable to FIG. 3.

The doping profile of the impurity ions 312 in the sections 207a and 209b of the IC 300 of FIG. 3 is at least in part similar to the doping profile of the impurity ions 212 in these sections in the IC 200 of FIG. 2A. For example, in the IC 300 of FIG. 3, referring to the section 207*a* of the layer 102 and the section 209*a* of the etch stop layer 120 (where the section 209*a* is above the section 207*a*) in the right side of the IC 300, the implanted impurity ions 312 are mostly within a region 310 that is within the section 207*a*, as illustrated. For example, the region 310 encompasses at least part of one or more of the devices 106. For example, referring to sections 207*a* and 209*a*, a majority of the impurity ions 312 (e.g., at least 60%, or at least 70%, or at least 80%, or at least 90%, or at least 95%, or at least 98%) implanted on the right side of the IC 300 are within the region 310 within the section 207*a*, and a minority of the impurity ions 312 (e.g., at most 40%, or at most 30%, or at most 20%, or at most 10%, or at most 5%, or at most 2%) implanted on the right side of the IC 300 are within the section 209*a*, as illustrated in FIG. 3.

Referring now to the section 207*b* of the layer 102 and the section 209*b* of the etch stop layer 120, very few impurity ions 312 are within the sections 209*b* and 207*b* (e.g., compared to a concentration of the impurity ions in section 207*a*). Also, a concentration of the impurity 312 within the section 209*b* is more than a concentration of the impurity 312 within the section 207*b*, although concentrations of impurity ions 312 within sections 209*b* and 207*b* is substantially less than the concentration of the impurity ions within section 207*a*.

Figure 4:
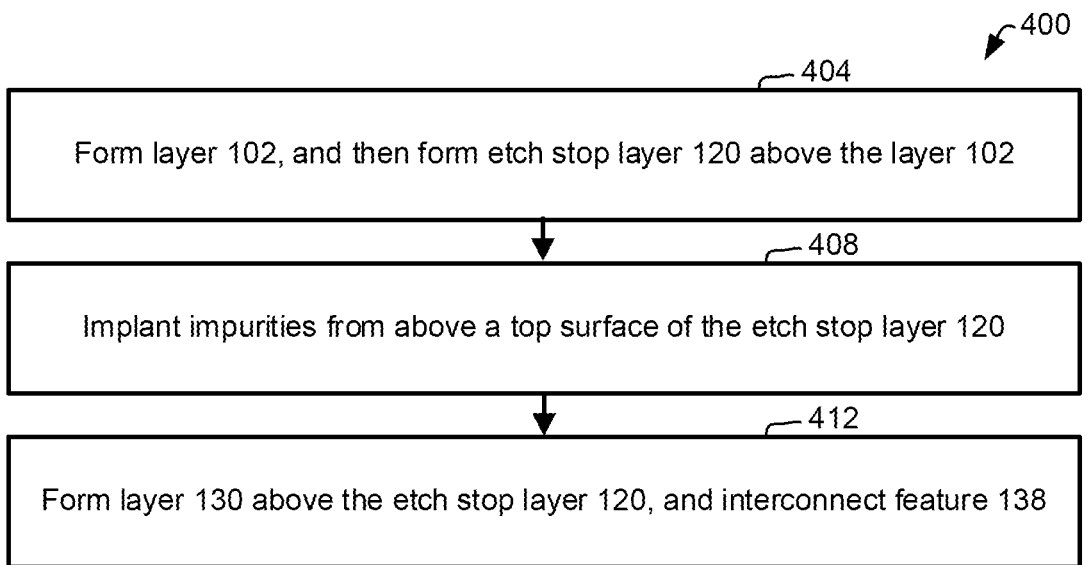
FIG. 4 illustrates a flowchart depicting a method of forming an IC (such as the IC of FIG. 1A) comprising (i) an underlayer (such as a device layer or an interconnect layer) comprising a plurality of devices and one or more interconnect features, (ii) an etch stop layer above the underlayer, and (iii) another layer (such as an interconnect layer) above the etch stop layer, wherein impurity ions are implanted through the etch stop layer and within the underlayer and/or the etch stop layer, and wherein the layer above the etch stop layer is substantially free of the impurity ions, in accordance with an embodiment of the present disclosure.

FIG. 4 illustrates a flowchart depicting a method 400 of forming an IC (such as the IC 100*a* of FIG. 1A) comprising (i) an underlayer 102 comprising a plurality of devices 106*a*, 106*b*, 106*c* and one or more interconnect features 108*a*, 108*b*, (ii) an etch stop layer 120 above the underlayer 102, and (iii) another layer 130 (such as an interconnect layer 130) above the etch stop layer 120, wherein impurity ions are implanted through the etch stop layer 120 and within the underlayer 102 and/or the etch stop layer 120, and wherein the layer 130 above the etch stop layer 120 is substantially free of the impurity ions, in accordance with an embodiment of the present disclosure. FIGS. 5A, 5B, 5C, 5D1, 5D2, 5D3, and 5E illustrate cross-sectional views of an IC (such as the IC 100 of FIG. 1A) in various stages of processing, in accordance with an embodiment of the present disclosure. FIGS. 4 and 5A-5E will be discussed in unison.

Figure 5A:
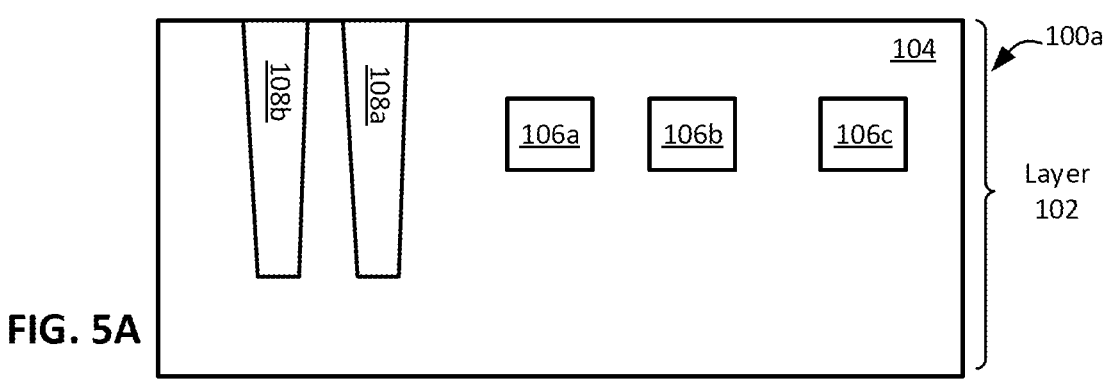
Figure 5B:
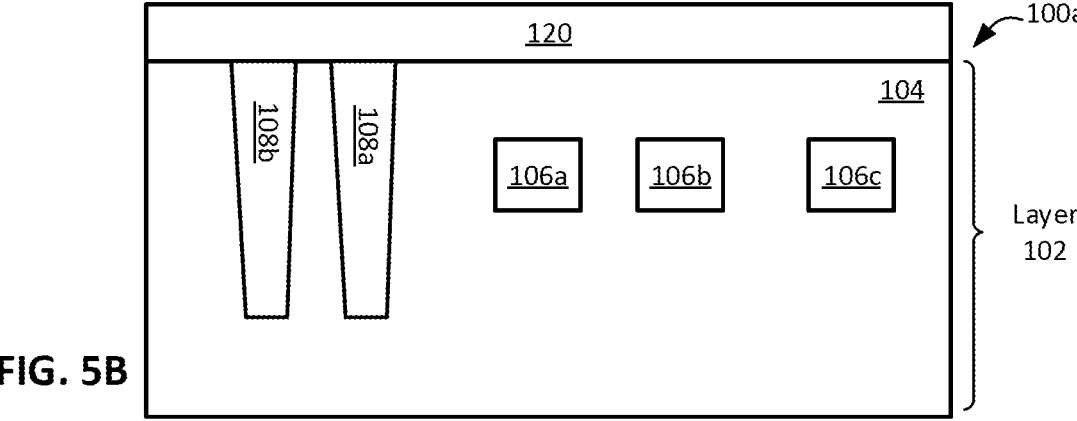
Figure 5C:
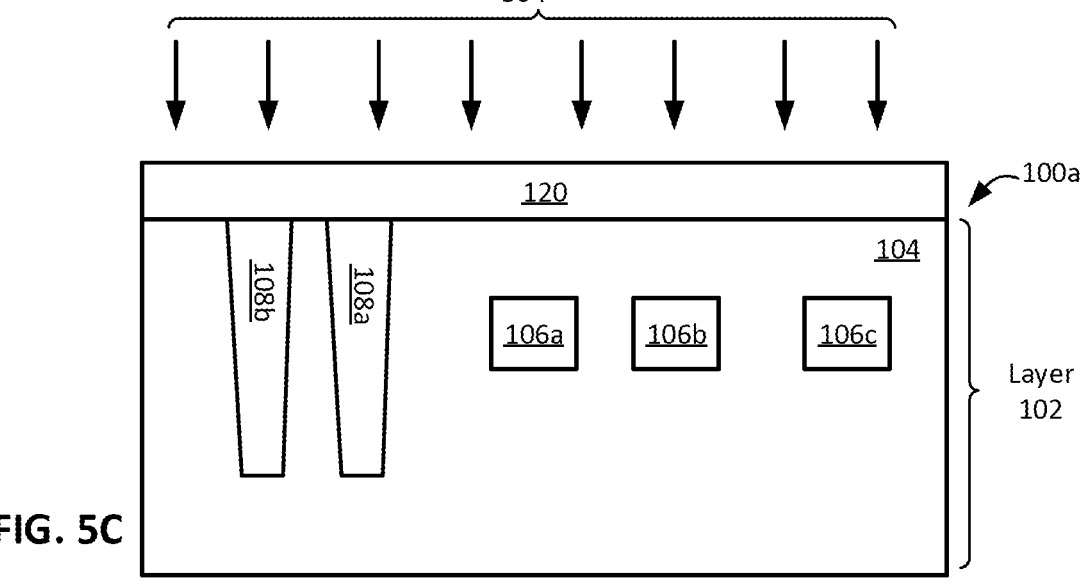

Referring to FIG. 4, the method 400 includes, at 404, forming the layer 102, and then depositing the etch stop layer 120 above the layer 102. For example, FIG. 5A illustrates the layer 102, which may be formed using any appropriate technique to form a layer comprising one or more devices and interconnect features therewithin. FIG. 5B illustrates the etch stop layer 120 deposited above the layer 102. The etch stop layer 120 may be deposited using an appropriate deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example.

Referring again to FIG. 4, the method 400 then proceeds from 404 to 408, where impurity ions are implanted from above a top surface of the etch stop layer 120. For example, arrows 504 in FIG. 5C symbolically illustrate the impurity ions being implanted. Merely as an example, beamline implantation, plasma implantation, spin-on implantation, or another appropriate implantation technique can be used to implant the impurity ions.

A depth at which majority of the impurity ions will be implanted depends on, for example, an energy used in the ion implantation process, a density of the etch stop layer 120, a permeability of the etch stop layer 120, a vertical height of the etch stop layer 120, and/or one or more other characteristics of the ion implantation process and/or the etch stop layer 120. Thus, in an example, the depth at which majority of the impurity ions will be implanted is a tunable parameter. For example, FIG. 5D1 illustrates the impurity ions being implanted at an average depth Da, similar to FIG. 1A; FIG. 5D2 illustrates the impurity ions being implanted at an average depth Db, similar to FIG. 1B; and FIG. 5D3 illustrates the impurity ions being implanted at an average depth Dc, similar to FIG. 1C.

Figure 5E:
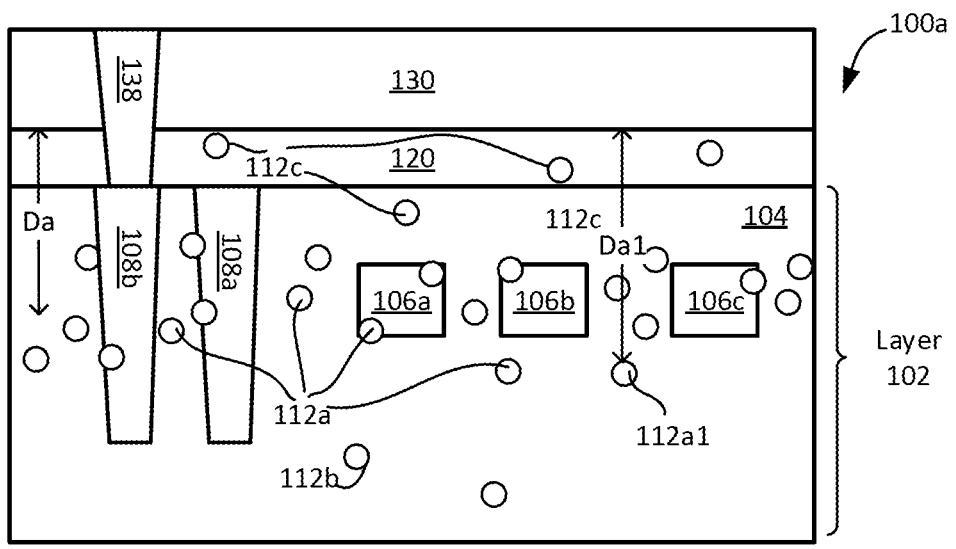

Referring again to FIG. 4, the method 400 then proceeds from 408 to 412, where layer 130 and the interconnect feature 138 are formed above the etch stop layer 120, as illustrated in FIG. 5E. In the example of FIG. 5E, an average depth Da of the impurity ions are assumed, e.g., similar to that in FIGS. 1A and 5D1. As the layer 130 and the interconnect feature 138 are formed after the implantation process, the layer 130 and the interconnect feature 138 are substantially free of the impurity ions. The IC 100*a* of FIG. 5E is similar to the IC 100*a* of FIG. 1A.

Note that the processes in method 400 are shown in a particular order for ease of description. However, one or more of the processes may be performed in a different order or may not be performed at all (and thus be optional), in accordance with some embodiments. Numerous variations on method 800 and the techniques described herein will be apparent in light of this disclosure.

FIG. 6 illustrates a flowchart depicting a method 600 of forming an IC (such as the IC 200 of FIG. 2A or the IC 300 of FIG. 3) comprising (i) a first layer 102 comprising a plurality of devices 106*a*, 106*b*, 106*c*, 211*a*, 211*b*, 211*c* and one or more interconnect features 108*a*, 108*b*, (ii) an etch stop layer 120 above the first layer 102, and (iii) a second layer 130 (such as an interconnect layer 130) above the etch stop layer 120, wherein the first layer 102 has a first section 207*a* and a laterally adjacent second section 207*b*, and impurity ions are implanted through the etch stop layer 120 and within the first layer 102 and/or the etch stop layer 120, such that a concentration of the impurity ions within the first section 207*a* is higher than a concentration of the impurity ions within the second section 207*b*, and wherein the second section 207*b* is substantially free of impurity ions, in accordance with an embodiment of the present disclosure. FIGS. 7A, 7B, 7C, 7D1, 7D2, 7E1, and 7E2 illustrate cross-sectional views of an IC (such as the IC 200 of FIG. 2A or the IC 300 of FIG. 3) in various stages of processing, in accordance with an embodiment of the present disclosure. FIGS. 6 and 7A-7E2 will be discussed in unison.

Referring to FIG. 6, the method 600 includes, at 604, forming the layer 102, and then depositing the etch stop layer 120 above the layer 102, e.g., as discussed with respect to the process 404 of the method 400 of FIG. 4 and as also illustrated in FIG. 7A.

In an example, the layer 102 has a section 207*a* and a laterally adjacent section 207*b*. The etch stop layer 120 has (i) section 209*a* above the section 207*a*, and (ii) section 209*b* laterally adjacent to the section 209*a* and above the section 207*b*, as also illustrated in FIG. 7A and as discussed in further detail herein previously.

Referring again to FIG. 6, the method 600 then proceeds from 604 to 608, where a sacrificial layer 720 is deposited above the section 209*b* of the etch stop layer 120, and not above the section 209*a* of the etch stop layer 120, as illustrated in FIG. 7B. In an example, a height, a density, and/or a permeability of the sacrificial layer 720 can be configured, to control a concentration and/or average depth of the impurity ions within the sections 209*b* and/or 207*b* below the sacrificial layer 720.

Referring again to FIG. 6, the method 600 then proceeds from 608 to 612, where impurity ions are implanted from above top surfaces of the sacrificial layer 720 and the section 209 of the etch stop layer 120. For example, arrows 704 in FIG. 7C symbolically illustrate the impurity ions being implanted. Merely as an example, beamline implantation, plasma implantation, spin-on implantation, or another appropriate implantation technique can be used to implant the impurity ions.

A depth at which majority of the impurity ions will be implanted depends on, for example, (i) an energy used in the ion implantation process, (ii) a density, a height, and/or a permeability of the sacrificial layer 720, and/or (iii) a density, a height, and/or a permeability of the etch stop layer 120, and the depth is a tunable by controlling the above parameters.

Referring to the sections 209*b* and 207*b* on the left side of the IC, for the impurity ions to be implanted in one or both the sections 209*a* and/or 207*b*, the impurity ions have to traverse through the sacrificial layer 720. For example, if the sacrificial layer 720 has relatively high vertical height, high density, and/or low permeability, relatively less impurity will reach the layers 207*b* and/or 209*b*. On the other hand, if the sacrificial layer 720 has relatively low vertical height, low density, and/or high permeability, relatively more impurity will reach the layers 207*b* and/or 209*b*.

For example, FIG. 7D1 illustrates a scenario where majority of the impurity ions implanted from above the sacrificial layer 720 (e.g., implanted on the left side of the IC) reaches the section 209*b* of the etch stop layer 120, some of the impurity ions traverse all the way to the section 207*b*, and some are trapped in the sacrificial layer 720), similar to the implant depth profile discussed in further detail with respect to FIG. 2A.

In another example, FIG. 7D2 illustrates a scenario where majority of the impurity ions implanted from above the sacrificial layer 720 are trapped within the sacrificial layer 720, and only some reach the section 209*b* of the etch stop layer 120, and some traverse all the way to the section 207*b*, similar to the implant depth profile discussed with respect to of FIG. 3.

In an example and as illustrated in both FIGS. 7D1 and 7D2, because the sacrificial layer 720 is absent above the section 209*a*, a majority of the impurity ions implanted from above the section 209*a* (e.g., implanted on the right side of the IC) travel through the section 209*a* of the etch stop layer 120 and are implanted within the section 207*a* of the layer 102, similar to the implant depth profile of the sections 207*a* and 209*a* discussed with respect to of FIGS. 2 and 3.

Although not illustrated in FIG. 7D1 or 7D2, a depth profile of the impurity ions, similar to that illustrated in FIG. 2B, may also be achieved, e.g., by appropriately tuning parameters (e.g., height, density, permeability) of the sacrificial layer 720. Any other target depth profile may also be achieved based on a target application of the IC, as will be appreciated based on the teachings of this disclosure.

Referring again to FIG. 6, the method 600 then proceeds from 612 to 616, where the sacrificial layer 720 is removed (e.g., using an appropriate etching technique), and the layer 130 and the interconnect feature 138 are formed above the etch stop layer 120, as illustrated in FIGS. 7E1 and 7E2. For example, FIG. 7E1 has the depth profile illustrated in FIG. 7D1 and is similar to the IC 200 of FIG. 2A; and FIG. 7E2 has the depth profile illustrated in FIG. 7D2 and is similar to the IC 300 of FIG. 3A.

Note that the processes in method 600 are shown in a particular order for ease of description. However, one or more of the processes may be performed in a different order or may not be performed at all (and thus be optional), in accordance with some embodiments. Numerous variations on method 800 and the techniques described herein will be apparent in light of this disclosure.

FIG. 8 illustrates a flowchart depicting a method 800 of forming an IC (such as the IC 200*c* of FIG. 2C) comprising a plurality of devices 106*a*, 106*b*, 106*c*, 211*a*, 211*b*, 211*c* and one or more interconnect features 108*a*, 108*b*, (ii) an etch stop layer 120 above the first layer 102, and (iii) a second layer 130 (such as an interconnect layer 130) above the etch stop layer 120, wherein the first layer 102 has a first section 207*a* and a laterally adjacent second section 207*b*, wherein a concentration of the impurity ions 212 within the first section 207*a* is higher than a concentration of the impurity ions 212 within the second section 207*b*, and wherein (i) the second layer 130 above the etch stop layer 120 and (ii) a section 209*a* of the etch stop layer 120 that is above the first section 207 of the first layer 102 are substantially free of the impurity ions 212, in accordance with an embodiment of the present disclosure. FIGS. 9A, 9B, 9C, and 9D illustrate cross-sectional views of an IC (such as the IC 200 of FIG. 2C) in various stages of processing, in accordance with an embodiment of the present disclosure. FIGS. 8 and 9A-9D will be discussed in unison.

Figure 9A:
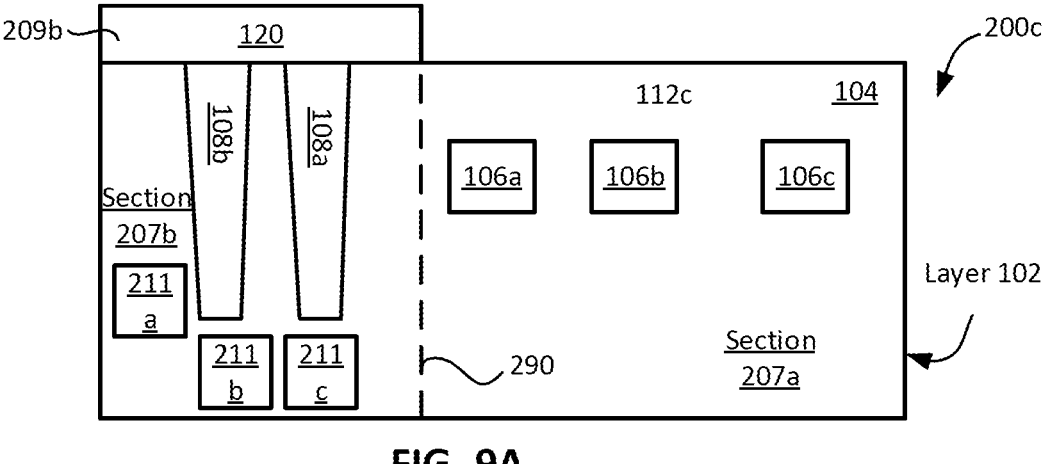
FIGS. 9A, 9B, 9C, and 9D illustrate cross-sectional views of an IC (such as the IC of FIG. 2C) in various stages of processing, in accordance with an embodiment of the present disclosure.
Figure 9B:
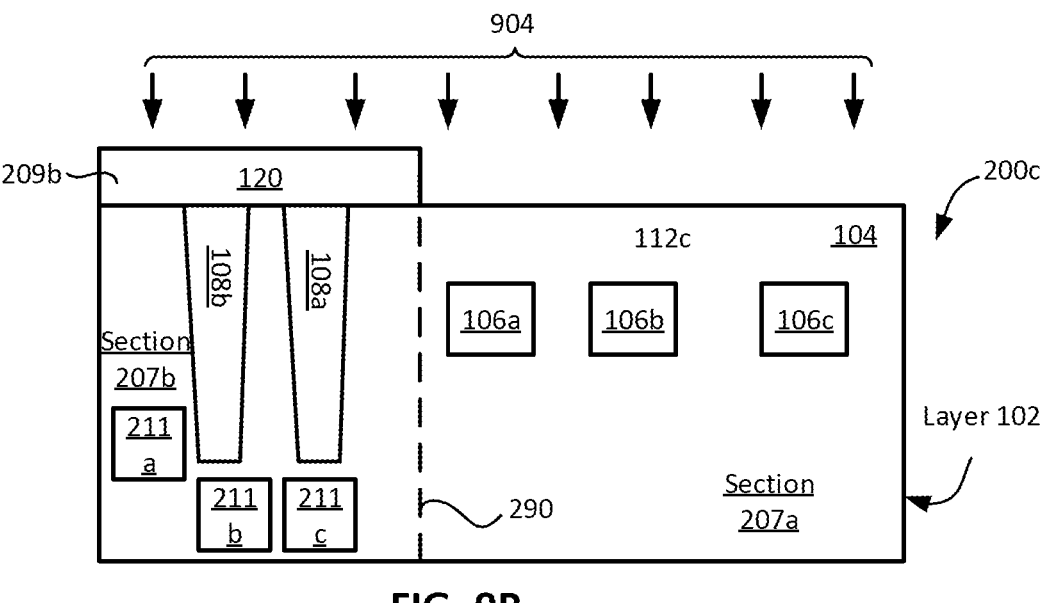

Referring to FIG. 8, the method 800 includes, at 804, forming the layer 102 having a section 207*a* and a laterally adjacent section 207*b*, and then forming a section 209*b* of the etch stop layer 120 above the section 207*b* of the layer 102, as illustrated in FIG. 9A. These layers are formed using techniques for forming an underlayer (such as an interconnect layer or a device layer) and an etch stop layer above the underlayer. The various sections of the layer 102 and the etch stop layer 120 have been discussed herein previously, e.g., with respect to FIGS. 2A-3.

Referring again to FIG. 8, the method 800 then proceeds from 804 to 808, where impurity ions are implanted from above top surfaces of the section 209*b* of the etch stop layer 120 and the section 207*a* of the layer 102. For example, arrows 904 in FIG. 9B symbolically illustrate the impurity ions being implanted. Merely as an example, beamline implantation, plasma implantation, spin-on implantation, or another appropriate implantation technique can be used to implant the impurity ions.

Figure 9C:
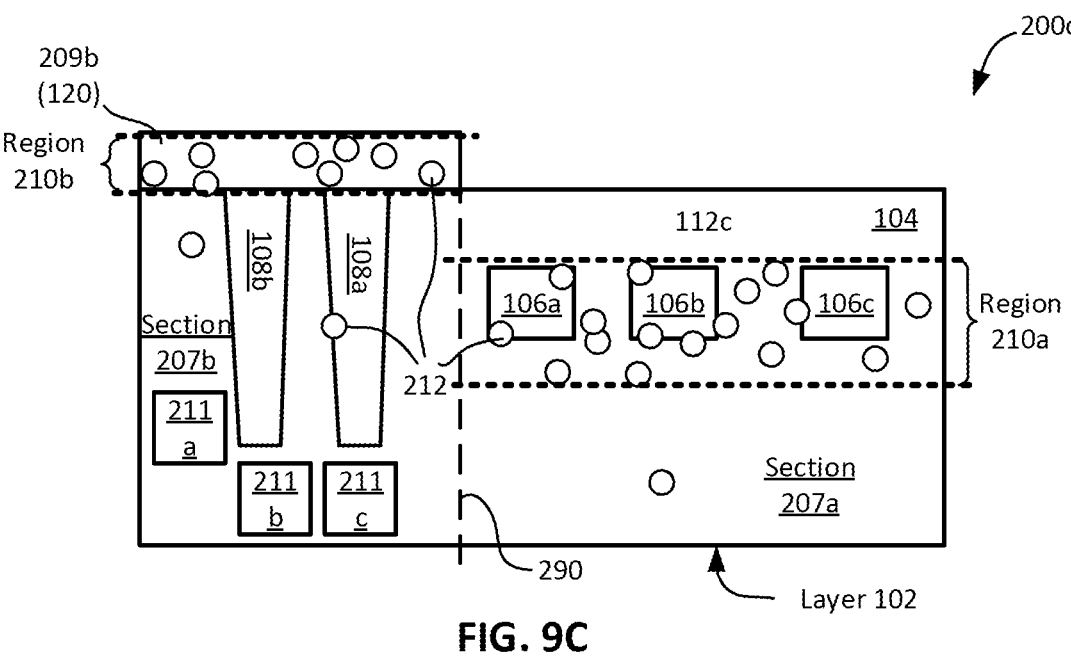

Referring to the sections 209*b* and 207*b* on the left side of the IC 200*c*, the impurity ions traverse through the section 209*b*, to reach the section 207*b*. A depth at which majority of the impurity ions will be implanted in the left side of the IC 200*c* depends on, for example, (i) an energy used in the ion implantation process, and (ii) a density, a height, and/or a permeability of the section etch stop layer 120, and the depth is a tunable by controlling the above parameters. In the example of FIG. 9C, a majority of the impurity ions are within the region 210*b* that is within the etch stop layer 120. However, although not illustrated in FIG. 9C, the region 210*b* may be partially or fully within the region 207*b*, although a depth of an upper surface of the region 210*b* in FIG. 9D will be less than a depth of an upper surface of the region 210*b* in FIG. 9D, as will be appreciated in view of this disclosure.

On the other hand, referring to section 207*a* on the right side of the IC 200*c*, the impurity ions are implanted directly from the top surface of the section 207*a*, i.e., doesn't have to traverse through any etch stop layer. Accordingly, a majority of the impurity ions are implanted deeper within the section 207a, e.g., within the region 210a that is at a lower level than the region 210b. Accordingly, a depth of an upper surface of the region 210a will be more than a depth of an upper surface of the region 210b.

Figure 9D:
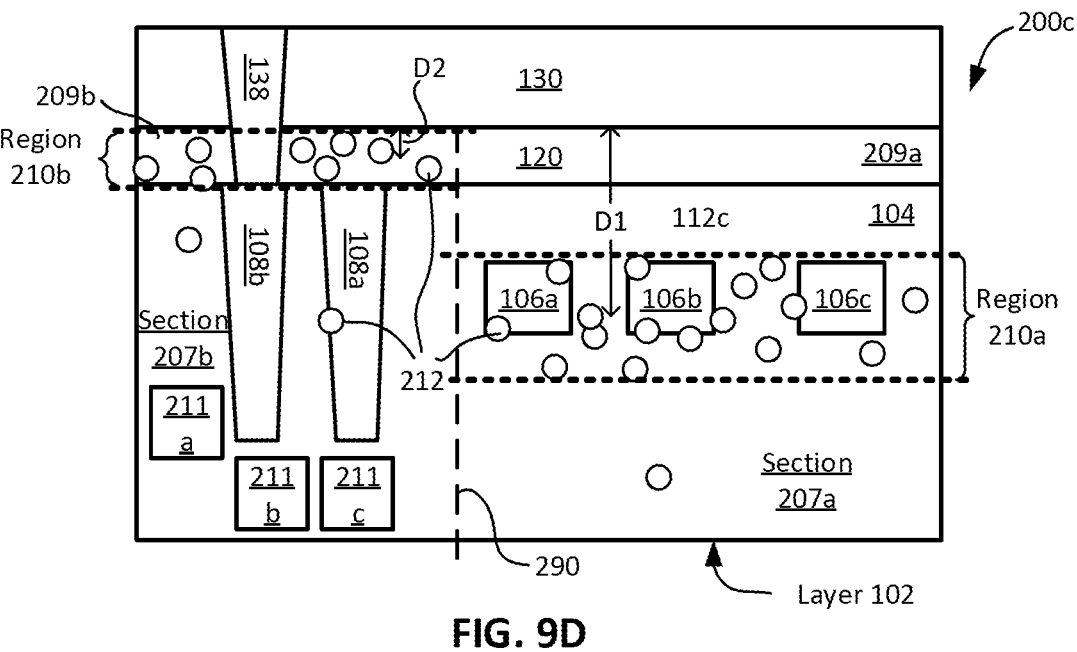

Referring again to FIG. 8, the method 800 then proceeds from 808 to 812, where the remining section 209a of the etch stop layer 120 is formed, and the layer 130 and the interconnect feature 138 are formed above the etch stop layer 120, as illustrated in FIG. 9D. As the section 209a of the etch stop layer 120, and the layer 130, and the interconnect feature 138 are formed subsequent to the implantation process, the section 209a of the etch stop layer 120, and the layer 130, and the interconnect feature 138 are substantially free of impurities, in an example. In an example, FIG. 9D has the depth profile that is similar to the depth profile illustrated in the IC 200c of FIG. 2C.

Note that the processes in method 800 are shown in a particular order for ease of description. However, one or more of the processes may be performed in a different order or may not be performed at all (and thus be optional), in accordance with some embodiments. Numerous variations on method 800 and the techniques described herein will be apparent in light of this disclosure.

Example System

Figure 10:
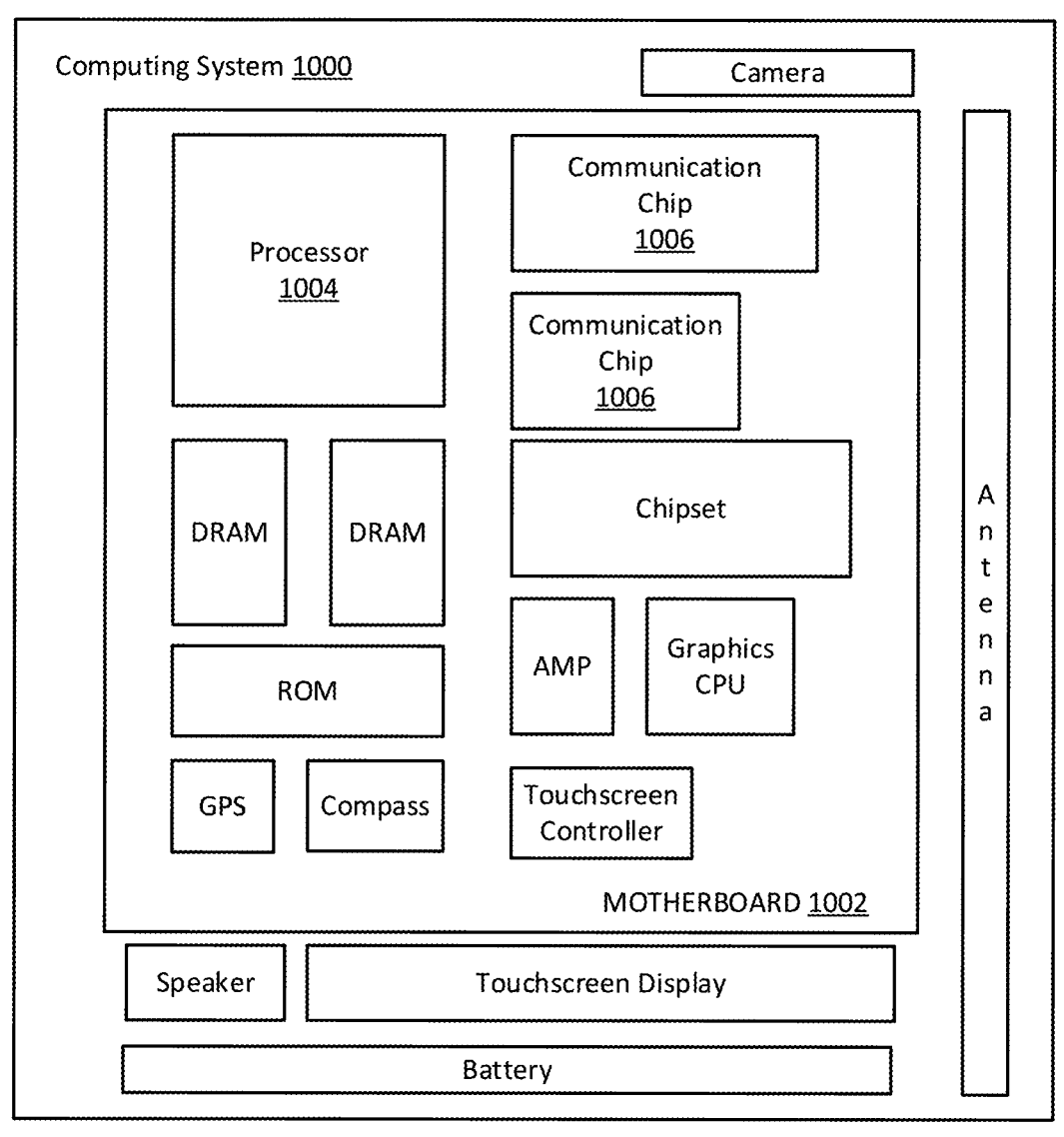
FIG. 10 illustrates a computing system implemented with integrated circuit structures formed using the techniques disclosed herein, in accordance with some embodiments of the present disclosure.

FIG. 10 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit comprising: a first layer comprising dielectric material, and one or both of an interconnect feature and a device within the dielectric material of the first layer; a second layer above the first layer, the second layer comprising dielectric material, and one or both of an interconnect feature and a device within the dielectric material of the second layer; and a third layer between the first layer and the second layer, the third layer having a thickness between the first and second layers in the range of 0.5 to 50 nanometers; and an impurity within the first layer and the third layer, the impurity having a detectable implant depth profile such that a first distribution of the impurity is within the first layer and a second distribution of the impurity is within the third layer.

Example 2. The integrated circuit of example 1, wherein the third layer is an etch stop layer.

Example 3. The integrated circuit of any one of examples 1-2, wherein the first layer and/or the second layer is an interconnect layer.

Example 4. The integrated circuit of any one of examples 1-3, wherein the implant depth profile of the impurity is not present in the second layer.

Example 5. The integrated circuit of any one of examples 1-4, wherein the interconnect feature is a first interconnect feature, and wherein the integrated circuit further comprises: a second interconnect feature extending within the second layer and the third layer, the second interconnect feature in contact with the first interconnect feature, wherein the implant depth profile of the impurity extends within the first interconnect feature, and does not extend within the second interconnect feature.

Example 6. The integrated circuit of any one of examples 1-5, wherein the impurity comprises one or more of carbon, helium, argon, or nitrogen.

Example 7. The integrated circuit of any one of examples 1-6, wherein: the first layer comprises a first section, and a second section laterally adjacent to the first section; the third layer comprises a third section above the first section of the first layer, and a fourth section above the second section of the first layer, the third section laterally adjacent to the fourth section; the first distribution includes a higher concentration of the impurity in the first section than in the second section; and the second distribution includes a higher concentration of the impurity in the fourth section than in the third section.

Example 8. The integrated circuit of example 7, wherein the implant depth profile of the impurity does not extend within the third section of the third layer.

Example 9. The integrated circuit of any one of examples 7-8, wherein the device is a transistor, and wherein the integrated circuit further comprises: a memory cell comprising the transistor and a capacitor, wherein the transistor is within the first section of the first layer, and wherein the second section of the first layer lacks a transistor of a memory cell.

Example 10. The integrated circuit of any one of examples 7-9, comprising: a memory cell comprising a transistor and a capacitor, wherein the transistor is within the first section of the first layer, and the capacitor is within the second layer.

Example 10a. The integrated circuit of example 10, wherein the transistor is a thin film transistor.

Example 10b. The integrated circuit of example 10, wherein: the transistor is a thin film transistor comprising a body including semiconductor material, a gate stack below the body, a first source or drain region above the body and coupled to a bit line of the memory cell, and a second source or drain region above the body and coupled to an electrode of the capacitor.

Example 10c. The integrated circuit of example 10b, wherein the body comprises one or more of indium, zinc, tin, silicon, germanium, yttrium, boron, aluminum, phosphorous, arsenic, gallium, copper, nickel, cobalt, tungsten, molybdenum, antimony, arsenic, oxygen, and nitrogen.

Example 11. The integrated circuit of any one of examples 7-8, comprising: a memory cell comprising a transistor and a capacitor, wherein the transistor of the memory cell is within the first section of the first layer; and a logic circuit associated with the memory cell within the second section of the first layer.

Example 12. The integrated circuit of any one of examples 1-11, wherein: the first layer comprises a first section and a second section, the first section laterally adjacent to the second section; the impurity within the first section of first layer is at a first average depth from a top surface of the third layer; and the impurity within the second section of first layer is at a second average depth from the top surface of the third layer, wherein the first average depth is more than the second average depth.

Example 13. The integrated circuit of example 12, wherein: the third layer comprises a third section above the first section of the first layer, and a fourth section above the second section of the first layer; and more than 60% of the impurity within the third layer is within the fourth section of the third layer.

Example 14. The integrated circuit of any one of examples 12-13, wherein: more than 60% of the impurity within the first layer is within the first section of the first layer.

Example 15. The integrated circuit of any one of examples 1-14, wherein a concentration of the impurity within the third layer is at most 10% of a concentration of the impurity within the first layer.

Example 16. An integrated circuit comprising: a layer comprising dielectric material, and having a first section and a second section, the first section laterally adjacent to the second section; an etch stop layer above the layer; and an impurity within the first and second sections of the layer and within the etch stop layer, wherein a distribution of the impurity within the first section of the layer is at a first average vertical distance from a top surface of the etch stop layer, wherein a distribution of the impurity within the second section of the layer is at a second average vertical distance from the top surface of the etch stop layer, the first average vertical distance different from the second average vertical distance.

Example 17. The integrated circuit of example 16, wherein a concentration of the impurity within the first section of the layer is different from a concentration of the impurity within the second section of the layer.

Example 18. The integrated circuit of any one of examples 16-17, wherein: the etch stop layer has a third section above the first section of the layer, and a fourth section above the second section of the layer, the third section laterally adjacent to the fourth section; and a concentration of the impurity within the third section of the etch stop layer is different from a concentration of the impurity within the fourth section of the etch stop layer.

Example 19. The integrated circuit of any one of examples 16-18, wherein the layer is a first layer, the integrated circuit comprising: a second layer above the etch stop layer, wherein the distribution of the impurity does not extend upwards within the second layer.

Example 20. A method of implanting an impurity within an integrated circuit, the method comprising: forming a layer comprising dielectric material, and one or both of an interconnect feature and a device within the dielectric material; forming an etch stop layer above at least a section of the layer; and implanting the impurity, through the etch stop layer, within the etch stop layer and layer.

Example 21. The method of example 20, wherein the layer has a first section and a second section, and wherein the method further comprises: forming the etch stop layer above the second section of the layer, such that the etch stop layer is not above the first section of the layer, wherein implanting the impurity comprises implanting the impurity (i) through the etch stop layer, within the etch stop layer and the second section of the layer, and (ii) within the first section of the layer, by bypassing the etch stop layer.

Example 22. The method of example 21, wherein: a concentration of the impurity within the etch stop layer is higher than a concentration of the impurity within the second section of the layer.

Example 23. The method of any one of examples 21-22, wherein the etch stop layer is a first etch stop layer, and wherein the method further comprises: forming a second etch stop layer above the first section of the layer, the second etch stop layer laterally adjacent to the first etch stop layer.

Example 24. The method of any one of examples 20-23, wherein the layer comprises (i) a first section and (ii) a second section laterally adjacent to the first section, wherein the etch stop layer comprises (i) a third section above the first section of the layer and (ii) a fourth section above the second section of the layer, the third section laterally adjacent to the fourth section, wherein the method comprises: forming a sacrificial layer above the fourth section of the etch stop layer, wherein implanting the impurity comprises implanting the impurity (i) through the sacrificial layer and through etch stop layer, within the etch stop layer and second section of the layer, and (ii) through the etch stop layer, within the first section of the layer.

Example 25. The method of example 24, wherein a concentration of the impurity within the first section of the layer is higher than a concentration of the impurity within the second section of the layer.

Example 26. The method of any one of examples 24-25, wherein the sacrificial layer is not formed above the third section of the etch stop layer.

Example 27. The method of any one of examples 24-26, further comprising: removing the sacrificial layer; and forming an interconnect layer above the third and third sections of the etch stop layer.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a first layer comprising dielectric material, and one or both of an interconnect feature and a device within the dielectric material of the first layer;
a second layer above the first layer, the second layer comprising dielectric material, and one or both of an interconnect feature and a device within the dielectric material of the second layer; and
a third layer between the first layer and the second layer, the third layer having a thickness between the first and second layers in the range of 0.5 to 50 nanometers; and
an impurity within the first layer and the third layer, the impurity having a detectable implant depth profile such that a first distribution of the impurity is within the first layer and a second distribution of the impurity is within the third layer,
wherein the dielectric material of the first layer comprises a first section and a second section, the first section laterally adjacent to the second section within the dielectric material of the first layer, the impurity within the first section is at a first average depth from a surface of the third layer, and the impurity within the second section is at a second average depth from the surface of the third layer, wherein the first average depth is more than the second average depth.

2. The integrated circuit of claim 1, wherein the third layer is an etch stop layer.

3. The integrated circuit of claim 1, wherein the first layer and/or the second layer is an interconnect layer.

4. The integrated circuit of claim 1, wherein the impurity is not present in the second layer.

5. The integrated circuit of claim 1, wherein the interconnect feature of the first layer is a first interconnect feature, and wherein the integrated circuit further comprises:
a second interconnect feature extending within the second layer and the third layer, the second interconnect feature in contact with the first interconnect feature,
wherein the implant depth profile of the impurity extends within the first interconnect feature, and does not extend within the second interconnect feature.

6. The integrated circuit of claim 1, wherein the impurity comprises one or more of carbon, helium, argon, or nitrogen.

7. The integrated circuit of claim 1, wherein:
the first layer comprises a third section, and a fourth section laterally adjacent to the third section;
the third layer comprises a fifth section above the third section of the first layer, and a sixth section above the fourth section of the first layer, the fifth section laterally adjacent to the sixth section;
the first distribution includes a higher concentration of the impurity in the third section than in the fourth section; and
the second distribution includes a higher concentration of the impurity in the sixth section than in the fifth section.

8. The integrated circuit of claim 7, wherein the implant depth profile of the impurity does not extend within the fifth section of the third layer.

9. The integrated circuit of claim 7, wherein the device is a transistor, and wherein the integrated circuit further comprises:
a memory cell comprising the transistor and a capacitor, wherein the transistor is within the third section of the first layer, and wherein the fourth section of the first layer lacks a transistor of a memory cell.

10. The integrated circuit of claim 7, comprising:

a memory cell comprising a transistor and a capacitor, wherein the transistor of the memory cell is within the third section of the first layer; and a logic circuit associated with the memory cell within the fourth section of the first layer.

11. The integrated circuit of claim 1, comprising:

a memory cell comprising a transistor and a capacitor, wherein the transistor is within the first layer, and the capacitor is within the second layer.

12. The integrated circuit of claim 11, wherein the transistor is a thin film transistor.

13. The integrated circuit of claim 11, wherein:

the transistor is a thin film transistor comprising a body including semiconductor material, a gate stack below the body, a first source or drain region above the body and coupled to a bit line of the memory cell, and a second source or drain region above the body and coupled to an electrode of the capacitor.

14. The integrated circuit of claim 1, wherein:

the third layer comprises a third section above the first section of the dielectric material of the first layer, and a fourth section above the second section of the dielectric material of the first layer; and more than 60% of the impurity within the third layer is within the fourth section of the third layer.

15. The integrated circuit of claim 1, wherein:

more than 60% of the impurity within the first layer is within the first section of the dielectric material of the first layer.

16. An integrated circuit comprising:

a layer comprising dielectric material, wherein the dielectric material of the layer has a first section and a second section, the first section laterally adjacent to the second section;

an etch stop layer above the layer; and an impurity within the first and second sections of the dielectric material of the layer and within the etch stop layer, wherein a distribution of the impurity within the first section is at a first average vertical distance from a top surface of the etch stop layer, wherein a distribution of the impurity within the second section is at a second average vertical distance from the top surface of the etch stop layer, the first average vertical distance different from the second average vertical distance.

17. The integrated circuit of claim 16, wherein a concentration of the impurity within the first section is different from a concentration of the impurity within the second section.

18. The integrated circuit of claim 16, wherein:

the etch stop layer has a third section above the first section of the dielectric material of the layer, and a fourth section above the second section of the dielectric material of the layer, the third section laterally adjacent to the fourth section; and a concentration of the impurity within the third section of the etch stop layer is different from a concentration of the impurity within the fourth section of the etch stop layer.

19. The integrated circuit of claim 16, wherein the layer is a first layer, the integrated circuit comprising:

a second layer above the etch stop layer, wherein the distribution of the impurity does not extend upwards within the second layer.

20. The integrated circuit of claim 16, wherein more than 60% of the impurity within the layer is within the first section of the dielectric material of the layer.

21. An integrated circuit comprising:

a first layer comprising dielectric material, and one or both of an interconnect feature and a device within the first layer;

a second layer above the first layer, the second layer comprising dielectric material; and a third layer between the first layer and the second layer, the third layer comprising dielectric material that is different than the dielectric material of the first and second layers; and an impurity within the first layer and the third layer, the impurity having a detectable implant depth profile such that a first distribution of the impurity is within the first layer and a second distribution of the impurity is within the third layer, wherein the dielectric material of the first layer comprises a first section and a second section, the first section laterally adjacent to the second section within the dielectric material of the first layer, the impurity within the first section is at a first average depth from a top surface of the third layer, and the impurity within the second section is at a second average depth from the top surface of the third layer, wherein the first average depth is more than the second average depth.

22. The integrated circuit of claim 21, wherein the impurity is not present in the second layer.

23. The integrated circuit of claim 21, wherein more than 60% of the impurity within the first layer is within the first section of the dielectric material of the first layer.

* * * * *